(12) United States Patent
Friedman et al.

(10) Patent No.: US 8,912,821 B2
(45) Date of Patent: Dec. 16, 2014

(54) LOGIC CELLS BASED ON SPIN DIODE AND APPLICATIONS OF SAME

(71) Applicant: Northwestern University, Evanston, IL (US)

(72) Inventors: Joseph S. Friedman, Rochester, NY (US); Nikhil Rangaraju, Elk Grove Village, IL (US); Yehea Ismail, Giza (EG); Bruce W. Wessels, Wilmette, IL (US)

(73) Assignee: Northwestern University, Evanston, IL (US)

( * ) Notice: Subject to any disclaimer, the term of this patent is extended or adjusted under 35 U.S.C. 154(b) by 216 days.

(21) Appl. No.: 13/657,233

(22) Filed: Oct. 22, 2012

(65) Prior Publication Data

US 2013/0063178 A1     Mar. 14, 2013

Related U.S. Application Data

(63) Continuation-in-part of application No. 13/528,505, filed on Jun. 20, 2012, now Pat. No. 8,552,759, and a continuation-in-part of application No. 13/401,581, filed on Feb. 21, 2012.

(60) Provisional application No. 61/559,499, filed on Nov. 14, 2011, provisional application No. 61/498,998, filed on Jun. 20, 2011, provisional application No. 61/444,974, filed on Feb. 21, 2011.

(51) Int. Cl.
*H03K 19/173* (2006.01)
*H01L 27/102* (2006.01)
*H03K 19/02* (2006.01)
*H01L 29/82* (2006.01)

(52) U.S. Cl.
CPC ........... *H01L 27/1021* (2013.01); *H01L 29/82* (2013.01); *H03K 19/02* (2013.01)
USPC ............ 326/38; 326/104; 326/124; 326/133; 326/101

(58) Field of Classification Search
USPC ......... 326/104, 112, 115, 118, 119, 121, 122, 326/123, 124, 130–135
See application file for complete search history.

(56) References Cited

U.S. PATENT DOCUMENTS 3,356,858 A     12/1967     Wanlass

OTHER PUBLICATIONS

Meindl, J.D. et al., Limits on Silicon Nanoelectronics for Terascale Integration, Science, 2001, vol. 293, 2044-2049.
Frank, D.J. et al., Device Scaling Limits of Si MOSFETs and Their Application Dependencies, Proc. IEEE, 2001, vol. 89, 259-288.
Bernstein, K. et al., Device and Architecture Outlook for Beyond CMOS Switches, Proc. IEEE, 2010, vol. 98, 2169-2184.
Chen, R.H. et al., Singleelectron Transistor Logic, Appl. Phys. Lett., 1996, vol. 68, 1954-1956.

(Continued)

*Primary Examiner* — Jany Richardson
(74) *Attorney, Agent, or Firm* — Morris, Manning & Martin, LLP; Tim Tingkang Xia, Esq.

(57) ABSTRACT

In one aspect, the invention relates to logic cells that utilize one or more of spin diodes. By placing one or two control wires on the side of the spin diodes to generate magnetic fields in the spin diodes due to input currents, the logic cell can be changed from one logic gate to another logic gate. The unique feature leads to field logic devices in which simple instructions can be used to construct a whole new set of logic gates.

38 Claims, 8 Drawing Sheets

(56) References Cited

OTHER PUBLICATIONS

Bachtold, Adrian et al., Logic Circuits with Carbon Nanotube Transistors, Science, 2001, vol. 294, 1317-1320.
Geim, A.K. et al., The Rise of Graphene, Nature Materials, 2007, vol. 6, 183-191.
Liao, L. et al., High Speed Graphene Transistors with a Self-Aligned Nanowire Gate, Nature, 2010, vol. 467, 305-308.
Huang, Yu et al., Logic Gates and Computation from Assembled Nanowire Building Blocks, Science, 2001, vol. 294, 1313-1317.
Collier, C.P. et al., Electronically Configurable Molecular-Based Logic Gates, Science, 1999, vol. 285, 391-394.
Datta, S. et al., Electronic Analog of the Electrooptic Modulator, Appl. Phys. Lett., 1990, vol. 56, 665-667.
Amlani, I. et al., Digital Logic Gate Using Quantum-Dot Cellular Automata, Science, 1999, vol. 284, 289-291.
Ney, A. et al., Programmable Computing with a Single Magnetoresistive Element, Nature, 2003, vol. 425, 485-487.
Allwood, D.A. et al., Magnetic Domain-Wall Logic, Science, 2005, vol. 309, 1688-1692.
Khitum, A. et al., Nano Scale Computational Architectures with Spin Wave Bus, Superlattices and Microstructures, 2005, vol. 38, 184-200.
May, S.J. et al., High-Field Magnetoresistance in p—(In,Mn)As/n—InAs Heterojunctions, Appl. Phys. Lett., 2006, vol. 88, 072105.
Imre, A. et al., Majority Logic Gate for Magnetic Quantum-Dot Cellular Automata, Science, 2006, vol. 311, 205-208.
Rangaraju, N. et al., Giant Magnetoresistance of Magnetic Semiconductor Heterojunctions, Phys. Rev. B., 2009, vol. 79, 205-209.
Sugahara, S. et al., Spin-Transistor Electronics: An Overview and Outlook, Proc. IEEE, 2010, vol. 98, 2124-2154.
Wolf, S.A. et al., The Promise of Nanomagnetics and Spintronics for Future Logic and Universal Memory, Proc. IEEE, 2010, vol. 98, 2155-2168.
Peters, J.A. et al., Spin-Dependent Magnetotransport in a p—InMnSb/n—InSb Magnetic Semiconductor Heterojunction, Phys. Lett., 2011, vol. 98, 193506.
Zutic, I. et al., Spin-Polarized Transport in Inhomogeneous Magnetic Semiconductors: Theory of Magnetic/Nonmagnetic p—n. Junctions, Phys. Rev. Lett., 2002, vol. 88, 066603.
Sklansky, J., Conditional-Sum Addition Logic, IRE Transactions on Electronic Computers, 1960, vol. 9, 226-231.
Katz, R.H., Contemporary Logic Design, (Benjamins/Cummings, Redwood City, CA 1994) 669-670.
I. Zutic et al., Spintronics: Fundamentals and applications, Rev. of Mod. Phys., 76, 2, 323-410 (2004).
D. D. Awschalom et al., Challenges for semiconductor spintronics, Nat. Phys., 3, 153-159 (2007).
C. Chappert et al., The emergence of spin electronics in data storage, Nature Materials, 6, 813-823 (2007).
I. Appelbaum et al., Electronic measurement and control of spin transport in silicon, Nature, 447, 295-298 (2007).
B. Q. Huang et al., 35% magnetocurrent with spin transport through Si, Appl. Phys. Lett., 91, 052501 (2007).
T. Dietl et al., Ferromagnetic Semiconductor Heterostructures for Spintronics, IEEE Trans. on Electron Devices, 54, 5, 945-954 (2007).
N. Lebedeva et al., Modeling of ferromagnetic semiconductor devices for spintronics, J. of Appl. Phys., 93, 12, 9845-9864 (2003).
J. Fabian et al., Spin transport in inhomogeneous magnetic fields: A proposal for Stem-Gerlach-like experiments with conduction electrons, Phys. Rev. B, 66, 024436 (2002).
R. R. Pela et al., Simulation of a spintronic transistor: A study of its performance, J. Magn. Magn. Mater., 321, 984-989 (2009).
I. Zutic et al., Bipolar spintronics: Fundamentals and applications, IBM, J. of Res. and Dev., 50, 1, 121 (2006).
B. W. Wessels, Ferromagnetic semiconductors and the role of disorder, New J. of Phys., 10, 055008 (2008).
P. T. Chiu et al., Dependence of magnetic circular dichroism on doping and temperature in $In_{1-x}Mn_xAs$, Phys. Rev. B, 76, 165201 (2007).
J. Fabian et al., Magnetic bipolar transistor, Appl. Phys. Lett., 84, 1, 85-87 (2004).
J. Fabian et al., The Ebers-Moll model for magnetic bipolar transistors, Appl. Phys. Lett., 86, 133506 (2005).
S. M. Sze et al., Physics of Semiconductor Devices (Wiley-Interscience, 2007).
G. W. Neudeck, The Bipolar Junction Transistor, Modular series on solid state devices (Addison-Wesley Publishing Company, Inc., 1989), vol. III.
Rangaraju, N. et al., Magnetoamplification in a Bipolar Magnetic Junction Transistor, Phys. Rev. Lett., 2010, vol. 105, 117202-1.
McCray, W.P., How Spintronics Went From the Lab to the iPod, Nat. Nanotechnol., 2009, vol. 4, 2.
Dery, H. et al., Spin-Based Logic in Semiconductors for Reconfigurable Large-Scale Circuits, Nature, 2007, vol. 447, 573.
Wessels, B.W., Ferromagnetic Semiconductors and the Role of Disorder, New J. Phys., 2008, vol. 10, 055008.

LOGIC CELLS BASED ON SPIN DIODE AND APPLICATIONS OF SAME

CROSS-REFERENCE TO RELATED PATENT APPLICATION

This application claims priority to and the benefit of, pursuant to 35 U.S.C. §119(e), U.S. provisional patent application Ser. No. 61/559,499, filed Nov. 14, 2011, entitled "A DIODE LOGIC FAMILY AND APPLICATIONS OF SAME," by Joseph S. Friedman, Nikhil Rangaraju, Yehea I. Ismail and Bruce W. Wessels, which is incorporated herein in its entirety by reference.

This application is also a continuation-in-part of U.S. patent application Ser. No. 13/528,505, filed Jun. 20, 2012, entitled "A PROGRAMMABLE LOGIC BASED ON A MAGNETIC DIODE AND APPLICATIONS OF SAME," by Bruce W. Wessels and Nikhil Rangaraju, which itself claims priority to and the benefit of, pursuant to 35 U.S.C. §119(e), U.S. provisional patent application Ser. No. 61/498,998, filed Jun. 20, 2011, entitled "A PROGRAMMABLE LOGIC BASED ON A MAGNETIC DIODE AND APPLICATIONS OF SAME," by Bruce W. Wessels and Nikhil Rangaraju, and is also a continuation-in-part of U.S. patent application Ser. No. 13/401,581, filed Feb. 21, 2012, entitled "A BIPOLAR MAGNETIC JUNCTION TRANSISTOR WITH MAGNETOAMPLIFICATION AND APPLICATIONS OF SAME," by Bruce W. Wessels, Nikhil Rangaraju and John A. Peters, which itself claims priority to and the benefit of, pursuant to 35 U.S.C. §119(e), U.S. provisional patent application Ser. No. 61/444,974, filed Feb. 21, 2011, entitled "A BIPOLAR MAGNETIC JUNCTION TRANSISTOR WITH MAGNETOAMPLIFICATION AND APPLICATIONS OF SAME," by Bruce W. Wessels, Nikhil Rangaraju and John A. Peters, all the disclosures of which are incorporated herein in their entireties by reference.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference. In terms of notation, hereinafter, "[n]" represents the nth reference cited in the reference list. For example, [17] represents the 17th reference cited in the reference list, namely, N. Rangaraju, P. C. Li, B. W. Wessels, Giant magnetoresistance of magnetic semiconductor heterojunctions. *Phys. Rev. B* 79, 205209 (2009).

STATEMENT OF FEDERALLY-SPONSORED RESEARCH

This invention was made with government support under DMR-0520513 and DMR-0800479 awarded by the National Science Foundation. The government has certain rights in the invention.

FIELD OF THE INVENTION

The present invention relates generally to logic cells, and more particularly to logic cells utilizing the magnetoresistance of spin diodes and applications of the same.

BACKGROUND OF THE INVENTION

Continued reduction in transistor sizes following Moore's Law has provided the technological basis for marked circuit performance improvements, making possible billion-transistor integrated circuits operating at gigahertz frequencies. The smaller size of these devices, however, results in increased fabrication difficulty, higher power densities, and parasitic effects that threaten to limit the further improvement of Si-based circuits [1, 2]. In an effort to provide continued improvements in computing performance, newly available materials and devices have been evaluated as building blocks for next-generation computing [3]. These technologies include devices derived from single-electron transistors [4], carbon nanotubes [5] and related graphene structures [6, 7], nanowires [7, 8], and molecular switches [9]. Additionally, there has been much interest in devices and logic techniques that utilize electron spin [10-20].

The emergence of new materials and devices has inspired reconsideration of conventional logic styles and circuit architectures. While complementary metal-oxide-semiconductor (CMOS) transistors and the accompanying CMOS logic family have dominated Si-based circuits [21], other devices and logic families have significant advantages. Diode logic is elegant in several respects, such as simple OR gates and single junction devices that allow for compact circuit structures. Circuits based on diode logic use fewer devices than their CMOS counterparts, and therefore potentially consume less power and area while operating at higher speeds. Diode logic, however, has historically been impractical due to the inability of a diode to behave as an inverter [22]. As inversion is a necessary function of a complete logic family, diodes, previous to these results, could only perform complex logic functions in concert with transistors.

Therefore, a heretofore unaddressed need exists in the art to address the aforementioned deficiencies and inadequacies.

SUMMARY OF THE INVENTION

In this invention, among other things, logic cells, circuits and apparatus that utilize bipolar semiconductor magnetic junctions as the magnetoresistive element such as magnetoresistive spin-diodes or other types of magnetic diodes are disclosed. Further, in this disclosure, complete logic cells using one or more of these spin diodes are shown.

In one aspect of the invention, a logic cell includes a spin diode having a non-magnetic semiconductor layer and a magnetic semiconductor layer disposed on the non-magnetic semiconductor layer, a voltage supply wire, a first control wire for receiving a first input current and a second control wire for receiving a second input current, and an output wire. The spin diode is configured such that under a forward bias, when a magnetic field applied to the spin diode is less than a threshold value, the spin diode is in a conductive state in which electric current flows through the spin diode, and when the magnetic field applied to the spin diode is greater than the threshold value, the spin diode is in a resistive state in which the electric current flowing through the spin diode is substantially reduced. The voltage supply wire is oriented along a first direction parallel to the magnetic semiconductor layer of the spin diode and positioned on the magnetic semiconductor layer for connecting the magnetic semiconductor layer to a voltage supply $V_{DD}$. The first control wire and the second control wire are oriented in parallel along the first direction and positioned on two sides of the spin diode and the voltage supply wire, such that when the first input current flows through the first control wire, the first input current induces a first magnetic field $B_1$ greater than the threshold value in the spin diode, and when the second input current flows through the second control wire, the second input current induces a second magnetic field $B_2$ greater than the threshold value in the spin diode. The output wire oriented along the first direction and positioned on the non-magnetic semiconductor layer of the spin diode for outputting a logic "0" or "1" responsive to the first input current and the second input current.

In one embodiment, the logic cell is a logic NOR gate or a logic XNOR gate.

In a further embodiment, the second input current is configured to flow through the second control wire in an opposite direction to the first input current flowing in the first control wire such that when the first input current flows through the first control wire and the second input current flows through the second control wire simultaneously, the first magnetic field $B_1$ induced by the first input current adds to the second magnetic field $B_2$ induced by the second input current to generate an added magnetic field $B_3$ greater than the threshold value in the spin diode, thereby implementing the logic NOR gate.

In a further embodiment, the second input current is configured to flow through the second control wire in the same direction as the first input current flowing in the first control wire such that when the first input current flows through the first control wire and the second input current flows through the second control wire simultaneously, the first magnetic field $B_1$ induced by the first input current nullifies the second magnetic field $B_2$ induced by the second input current to generate a subtracted magnetic field $B_4$ less than the threshold value in the spin diode, thereby implementing the logic XNOR gate.

In one embodiment, the non-magnetic semiconductor layer comprises an n-type doped III-V compound containing an element of Group III and an element of Group V. The non-magnetic semiconductor layer in one embodiment includes n-type doped InAs.

In one embodiment, the magnetic semiconductor layer comprises a p-type doped III-Mn-V compound containing an element of Group III, Manganese (Mn) and an element of Group V. In one embodiment, the magnetic semiconductor layer comprises p-type doped InMnAs.

In one embodiment, the magnetic semiconductor layer forms an anode of the spin diode, and the non-magnetic semiconductor layer forms a cathode of the spin diode.

In one embodiment, the output wire is connected to ground.

In one embodiment, the output wire is connected to one of the first and second control wires for another logic cell.

In another aspect of the invention, a logic cell includes a spin diode having a non-magnetic semiconductor layer and a magnetic semiconductor layer disposed on the non-magnetic semiconductor layer, a voltage supply wire, a first control wire for receiving a first input current, and an output wire. The spin diode is configured such that under a forward bias, when a magnetic field applied to the spin diode is less than a threshold value, the spin diode is in a conductive state in which electric current flows through the spin diode, and when the magnetic field applied to the spin diode is greater than the threshold value, the spin diode is in a resistive state in which the electric current flowing through the spin diode is substantially reduced. The voltage supply wire is oriented along a first direction parallel to the magnetic semiconductor layer of the spin diode and positioned on the magnetic semiconductor layer for connecting the magnetic semiconductor layer to a voltage supply $V_{DD}$. The first control wire is oriented along the first direction and positioned on one side of the spin diode and the voltage supply wire, such that when the first input current flows through the first control wire, the first input current induces a first magnetic field $B_1$ greater than the threshold value in the spin diode. The output wire is oriented along the first direction and positioned on the non-magnetic semiconductor layer of the spin diode for outputting a logic "0" or "1" responsive to the first input current.

In one embodiment, the logic cell is a logic inverter.

In one embodiment, the logic cell further includes a second control wire for receiving a second input current. The second control wire is in parallel to the first control wire and positioned on the other side of the spin diode and the voltage supply wire, such that when the second input current flows through the second control wire, the second input current induces a second magnetic field $B_2$ greater than the threshold value in the spin diode, so as to implement a logic NOR gate or a logic XNOR gate.

In a further embodiment, the second input current is configured to flow through the second control wire in an opposite direction to the first input current flowing in the first control wire such that when the first input current flows through the first control wire and the second input current flows through the second control wire simultaneously, the first magnetic field $B_1$ induced by the first input current adds to the second magnetic field $B_2$ induced by the second input current to generate an added magnetic field $B_3$ greater than the threshold value in the spin diode, thereby implementing the logic NOR gate.

In a further embodiment, the second input current is configured to flow through the second control wire in the same direction as the first input current flowing in the first control wire such that when the first input current flows through the first control wire and the second input current flows through the second control wire simultaneously, the first magnetic field $B_1$ induced by the first input current nullifies the second magnetic field $B_2$ induced by the second input current to generate a subtracted magnetic field $B_4$ less than the threshold value in the spin diode, thereby implementing the logic XNOR gate.

In one embodiment, the non-magnetic semiconductor layer comprises an n-type doped III-V compound containing an element of Group III and an element of Group V. The non-magnetic semiconductor layer in one embodiment includes n-type doped InAs.

In one embodiment, the magnetic semiconductor layer comprises a p-type doped III-Mn-V compound containing an element of Group III, Manganese (Mn) and an element of Group V. In one embodiment, the magnetic semiconductor layer comprises p-type doped InMnAs.

In one embodiment, the magnetic semiconductor layer forms an anode of the spin diode, and the non-magnetic semiconductor layer forms a cathode of the spin diode.

In one embodiment, the output wire is connected to ground.

In one embodiment, the output wire is connected to the first control wire for another logic cell.

Another aspect of the invention discloses a logic cell, which includes first, second, third, fourth, fifth and sixth spin diodes. Each spin diode has a cathode and an anode. Each of the first, second, third, fourth and fifth spin diodes has a first control wire and a second control wire oriented in parallel and positioned on two sides of the spin diode, and the sixth spin diode has a control wire positioned on one side of the sixth spin diode. Each spin diode is configured such that under a forward bias, when a magnetic field applied to the spin diode is less than a threshold value, the spin diode is in a conductive state in which electric current flows through the spin diode, and when the magnetic field applied to the spin diode is greater than the threshold value, the spin diode is in a resistive state in which the electric current flowing through the spin diode is substantially reduced. When a control current flows through one of the first and second control wires of each of the first, second, third, fourth and fifth spin diodes, the control current induces a magnetic field greater than the threshold value in the spin diode. For each of the first, second and third spin diodes, the second control current is configured to flow through the second control wire in an opposite direction to the first control current flowing in the first control wire such that when the first control current flows through the first control wire and the second input current flows through the second control wire simultaneously, the first magnetic field induced by the first control current adds to the second magnetic field induced by the second control current to generate an added magnetic field greater than the threshold value in the spin diode, thereby implementing a logic NOR gate. For each of the fourth and fifth spin diodes, the second control current is configured to flow through the second control wire in the same direction as the first control current flowing in the first control wire such that when the first control current flows through the first control wire and the second control current flows through the second control wire simultaneously, the first magnetic field induced by the first control current nullifies the second magnetic field induced by the second control current to generate a subtracted magnetic field less than the threshold value in the spin diode, thereby implementing a logic XNOR gate. For the sixth diode, when a control current flows through the control wire of the sixth spin diode, the control current induces a magnetic field greater than the threshold value in the sixth spin diode, thereby implementing a logic inverter.

A second end of the first control wire of the first spin diode is electrically connected to a first end of the first control wire of the third spin diode. A second end of the second control wire of the first spin diode is electrically connected to a first end of the first control wire of the second spin diode. A second end of the first control wire of the second spin diode is electrically connected to a first end of the first control wire of the fifth spin diode. A second end of the second control wire of the second spin diode is electrically connected to a first end of the second control wire of the third spin diode. A second end of the first control wire of the third spin diode is electrically connected to a first end of the first control wire of the fourth spin diode. A second end of the second control wire of the third spin diode is electrically connected to a first end of the second control wire of the fourth spin diode. The cathodes of the first, second and third spin diodes are electrically connected to a first end of the control wire of the sixth spin diode. The cathode of the fourth spin diode is electrically connected to a first end of the second control wire of the fifth spin diode.

The logic cell further includes first, second and third input terminals, first and second voltage supply, a sum output terminal, and a carry-out output terminal. The first input terminal is electrically connected to a first end of the first control wire of the first spin diode for providing a first input current, $I_A$. The second input terminal is electrically connected to a first end of the second control wire of the first spin diode for providing a second input current, $I_B$. The third input terminal is electrically connected to a first end of the second control wire of the second spin diode for providing a third input current, $I_C$. The first voltage supply is electrically connected to the anodes of the first, second, third, fourth and fifth spin diodes for providing a first supply voltage, $V_{DD1}$. The second voltage supply electrically connected to the anode of the sixth spin diode for providing a second supply voltage, $V_{DD2}$. The sum output terminal is electrically connected to the cathode of the fifth spin diode for outputting a sum output signal of a logic "0" or "1" responsive to the first input current $I_A$, the second input current $I_B$, and the third input current $I_C$. The carry-out output terminal is electrically connected to the cathode of the sixth spin diode for outputting a carry-out output signal of the logic "0" or "1" responsive to the first input current $I_A$, the second input current $I_B$, and the third input current $I_C$.

In one embodiment, the logic cell is a logic one-bit full adder.

In a further embodiment, the sum output terminal is configured to output the logic "0" when no input current is provided by any of the first, second and third input terminals, or when exactly two of the first input current $I_A$, the second input current $I_B$, and the third input current $I_C$ are provided by the first, second and third input terminals, and to output the logic "1" when exactly one of the first input current $I_A$, the second input current $I_B$, and the third input current $I_C$ is provided by the first, second and third input terminals, or when all of the first input current $I_A$, the second input current $I_B$, and the third input current $I_C$ are provided by the first, second and third input terminals, respectively.

In a further embodiment, the carry-out output terminal is configured to output the logic "0" when no input current is provided by any of the first, second and third input terminals, or when exactly one of the first input current $I_A$, the second input current $I_B$, and the third input current $I_C$ is provided by the first, second and third input terminals, and to output the logic "1" when exactly two of the first input current $I_A$, the second input current $I_B$, and the third input current $I_C$ are provided by the first, second and third input terminals, or when all of the first input current $I_A$, the second input current $I_B$, and the third input current $I_C$ are provided by the first, second and third input terminals, respectively.

In yet another aspect of the invention, a logic cell includes first and second spin diodes. Each of the first and second spin diodes has a cathode and an anode, and a first control wire and a second control wire oriented in parallel and positioned on two sides of the spin diode, and is configured such that under a forward bias, when a magnetic field applied to the spin diode is less than a threshold value, the spin diode is in a conductive state in which electric current flows through the spin diode, and when the magnetic field applied to the spin diode is greater than the threshold value, the spin diode is in a resistive state in which the electric current flowing through the spin diode is substantially reduced. When a control current flows through one of the first and second control wires, the control current induces a magnetic field greater than the threshold value in the spin diode. When a first control current flows through the first control wire in an opposite direction to a second control current flowing through the second control wire simultaneously, the first magnetic field induced by the first control current adds to the second magnetic field induced by the second control current to generate an added magnetic field greater than the threshold value in the spin diode, thereby implementing a logic NOR gate. The cathode of the first spin diode is electrically connected to a first end of the first control wire of the second spin diode, and the cathode of the second spin diode is electrically connected to a first end of the second control wire of the first spin diode.

The logic cell further includes first and second input terminals, a voltage supply, and a first output terminal. The first input terminal is electrically connected to a first end of the first control wire of the first spin diode for providing a first input current, $I_A$. The second input terminal is electrically connected to a first end of the second control wire of the second spin diode for providing a second input current, $I_B$. The voltage supply is electrically connected to the anodes of the first and second spin diodes for providing a supply voltage, $V_{DD}$. The first output terminal electrically connected to a second end of the first control wire of the second spin diode for outputting a logic "0" or "1" responsive to the first input current $I_A$ and the second input current $I_B$.

In one embodiment, the logic cell is a logic latch.

In a further embodiment, the first output terminal is configured to output the logic "0" when the first input current $I_A$ is provided by the first input terminal, and to output the logic "1" when the second input current $I_B$ is provided by the second input terminal. In yet a further embodiment, the first output terminal is configured to remain outputting the same logic signal "0" or "1" when no input current is provided by the first and second input terminals.

In a one embodiment, the logic cell further includes a second output terminal electrically connected to a second end of the second control wire of the first spin diode for outputting the logic "0" or "1" responsive to the first input current $I_A$ and the second input current $I_B$. In a further embodiment, the second output terminal is configured to output the logic "0" when the second input current $I_B$ is provided by the second input terminal, and to output the logic "1" when the first input current $I_A$ is provided by the second input terminal. In yet a further embodiment, the second output terminal is configured to remain outputting the same logic signal "0" or "1" when no input current is provided by the first and second input terminals.

In yet a further aspect of the invention, a logic apparatus includes at least one logic cell as disclosed above.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1A:
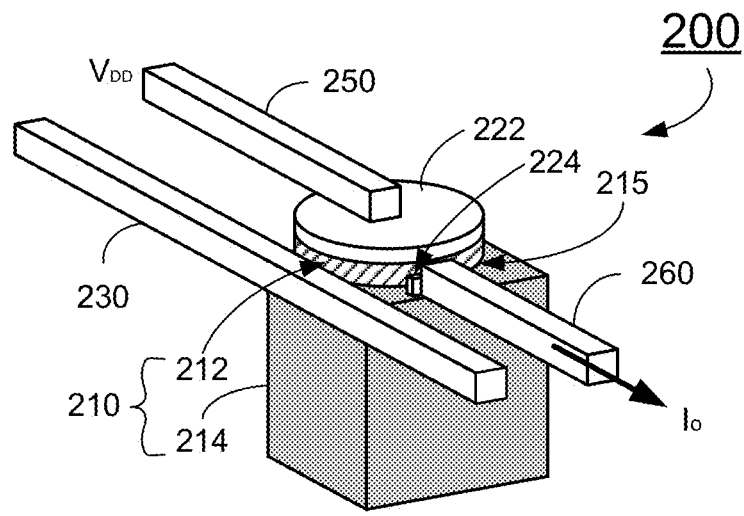
FIG. 1A shows schematically a prospective view of a logic cell according to one embodiment of the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that, as used in the description herein and throughout the claims that follow, the meaning of "a", "an", and "the" includes plural reference unless the context clearly dictates otherwise. Also, it will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising," "including," "carrying," "having," "containing," "involving," and the like are to be understood to be open-ended, i.e., to mean including but not limited to.

The description will be made as to the embodiments of the present invention in conjunction with the accompanying drawings in FIGS. 1-8. In accordance with the purposes of this invention, as embodied and broadly described herein, this invention, in one aspect, relates to spin diode based logic that utilizes the magnetoresistance of spin diodes to operate the logic from one logic gate to another logic gate.

The invention of the magnetoresistive spin-diode provides an alternative opportunity, as these spin-diodes can be used individually as inverters [15], permitting the development of a complete diode logic family, which is now possible because of the present invention. Though heretofore impractical, diode logic allows for the execution of logic circuits that are faster, smaller, and dissipate less power than conventional Si architectures.

Magnetoresistive semiconductor spin-diodes act as conventional diodes in the presence of zero or low magnetic fields, with a high ratio of forward current to reverse current. However, when a magnetic field is applied across the junction, there is splitting in the valence and conduction bands in the magnetic semiconductor [23].

Referring to FIG. 1A, a logic cell is shown schematically according to one embodiment of the present invention. As shown in FIG. 1A, the logic cell 200 includes a spin diode 210 having a non-magnetic semiconductor layer 214 and a magnetic semiconductor layer 212 disposed on the non-magnetic semiconductor layer 214, and a heterojunction 215 is formed at an interface region between the magnetic semiconductor layer 212 and the non-magnetic semiconductor layer 214. The magnetic semiconductor layer 212 is formed of a magnetic semiconductor, and the non-magnetic semiconductor layer 214 is formed of a non-magnetic semiconductor. In one embodiment, the magnetic semiconductor layer 212 forms an anode of the spin diode 210, and the non-magnetic semiconductor layer 214 forms a cathode of the spin diode 210. As shown in FIG. 1A, the magnetic semiconductor layer 212 has a circular disc shape, and the non-magnetic semiconductor layer 214 has a block shape. Thus, the plane of the heterojunction 215 is parallel to the magnetic semiconductor layer 212. However, it should be appreciated that the magnetic semiconductor layer 212 and the non-magnetic semiconductor layer 214 of the spin diode may be formed in other shapes.

When such a spin diode 210 is operated in the turn-on region in a forward bias, the diode current is strongly dependent on the presence of magnetic fields. Magnetic fields applied either parallel (longitudinal) or perpendicular (transverse) to the flow of current through the heterojunction 215 of the spin diode 210 lead to a positive magnetoresistance. The heterojunction magnetoresistance is substantially proportional to the applied magnetic field. As such, for the spin diode 210 operated under the forward bias, when a magnetic field applied to the spin diode 210 is less than a threshold value $B_{th}$, the spin diode 210 is in a conductive state in which electric current flows through the spin diode 210, and when the magnetic field applied to the spin diode 210 is greater than the threshold value $B_{th}$, the spin diode 210 is in a resistive state in which the electric current flowing through the spin diode 210 is substantially reduced.

In one embodiment, the magnetic semiconductor layer 212 is formed of a p-type doped III-Mn-V compound containing an element of Group III, Manganese (Mn) and an element of Group V, for example, p-type doped InMnAs. In one embodiment, the non-magnetic semiconductor layer 214 is formed of an n-type doped III-V compound containing an element of Group III and an element of Group V, for example, n-type doped InAs.

As shown in FIG. 1A, the logic cell 200 further includes a voltage supply wire 250, a first control wire 230 for receiving a first input current, and an output wire 260, which are all oriented along a first direction parallel to the heterojunction 215 and the magnetic semiconductor layer 212 of the spin diode 210. The voltage supply wire 250 serves as a wire connected to the positive terminal of the spin diode 210, which is connected to a contact 222 positioned on the magnetic semiconductor layer 212 for connecting the magnetic semiconductor layer 212 to a voltage supply $V_{DD}$. The output wire 260 serves as a wire connected to the negative terminal of the spin diode 210, which is connected to a contact 224 positioned on the non-magnetic semiconductor layer 214 of the spin diode 210 for outputting an output current $I_o$ representing a logic "0" or "1" responsive to the first input current flowing through the first control wire 230. Thus, a current flows through the voltage supply wire 250 directly from the voltage supply $V_{DD}$ to the magnetic semiconductor layer 212 (i.e. the anode of the spin diode 210), through the heterojunction 215, and then through the output wire 260 directly from the non-magnetic semiconductor layer 214 (i.e. the cathode of the spin diode 210) before eventually being connected to ground. In a multiple logic cell circuit, the voltage supply wire 250 and the output wire 260 may be routed through the circuit to serve as the control wire or the input wire for other logic cells, before eventually being grounded.

The first control wire 230 is positioned on one side of the spin diode 210 and the voltage supply wire 250, and is insulated from the spin diode 210. The distance of the first control wire 230 from the heterojunction 215 of the spin diode may be configured such that the first input current flowing through the first control wire 230 may be used to control the magnetoresistive state of the spin diode 210 and the output logic signal of the output wire 260. When the first input current flows through the first control wire 230, the first input current induces a first magnetic field $B_1$ greater than the threshold value $B_{th}$ in the spin diode 210 such that the spin diode 210 is in the resistive state for outputting no output current (or a relatively "low" current) through the output wire 260, which represents a logic "0". On the other hand, when no current flows through the first control wire 230 such that no magnetic field exists in the spin diode 210, or when the current flows through the first control wire 230 is so small or so low that the magnetic field induced in the spin diode 210 is less than the threshold value $B_{th}$, the spin diode 210 is in the conductive state for outputting the output current $I_o$ (or a relatively "high" current) through the output wire 260, which represents a logic "1".

The first input current flowing through the first control wire 230 may be identified with the logic "0" when no current (or a relatively low current) flows through the first control wire 230, and with the logic "1" when the first input current $I_A$ (which is a relatively high current) flows through the first control wire 230 in either direction. Thus, the first control wire 230 may be used to control the magnetic fields generated in the spin diode 210 and define the operations of the logic cell 200 as shown in FIG. 1A for physical implementations of a logic family, including logic gates such as a logic inverter.

Figure 1B:
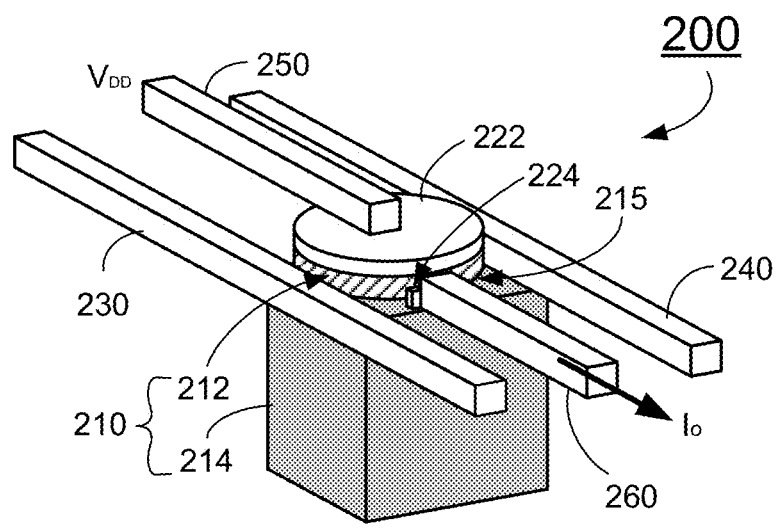
FIG. 1B shows schematically a prospective view of a logic cell according to a further embodiment of the present invention.

FIG. 1B shows schematically a prospective view of a logic cell according to a further embodiment of the present invention. The logic cell 200 as shown in FIG. 1B includes all elements as shown in FIG. 1A, and further includes a second control wire 240 for receiving a second input current. The second control wire 240 is in parallel to the first control wire 230 and positioned on the other side of the spin diode 210 and the voltage supply wire 250, and is insulated from the spin diode 210. In other words, the first control wire 230 and the second control wire 240 are oriented in parallel along the first direction and positioned on two sides of the spin diode 210 and the voltage supply wire 250. Similarly, the distance of the second control wire 240 from the heterojunction 215 of the spin diode 210 may be configured such that the second input current flowing through the second control wire 240 may be also used to control the magnetoresistive state of the spin diode 210 and the output logic signal of the output wire 260. When the second input current flows through the second control wire 240, the second input current induces a second magnetic field $B_2$ greater than the threshold value $B_{th}$ in the spin diode 210 such that the spin diode 210 is in the resistive state for outputting no output current through the output wire 260, which represents a logic "0". On the other hand, when no current flows through the second control wire 240 such that no magnetic field exists in the spin diode 210, or when the current flows through the second control wire 240 is so small or so low that the magnetic field induced in the spin diode 210 is less than the threshold value $B_{th}$, the spin diode 210 is in the conductive state for outputting the output current $I_o$ through the output wire 260, which represents a logic "1".

The first input current and the second input current flowing through the first control wire 230 and the second control wire 240 may be identified with the logic "0" when there is no current (or a relatively low current) flows therethrough, and with the logic "1" when the first and second input currents flow through the first and second control wires 230 and 240 in either direction, respectively. Thus, by determining the relative directions of the first and second input currents, the first and second control wires 230 and 240 may be used to control the magnetic fields generated in the spin diode 210 and define the operations of the logic cell 200 as shown in FIG. 1B for physical implementations of a logic family, including logic gates such as a logic inverter, a logic NOR gate or a logic XNOR gate.

It should be appreciated that the first control wire 230 as shown in FIGS. 1A and 1B and the second control wire 240 as shown in FIG. 1B are oriented in parallel and positioned on the sides of the spin diode 210 and the voltage supply wire 250. Thus, the first and second control wires 230 may be formed of electrically conductive wires, lines, bars or other rigid structures, and is subject to nominal deformation due to gravity, magnetic force or other environmental factors, such that the position of the control wires relative to the spin diode 210 can be maintained.

Figure 2:
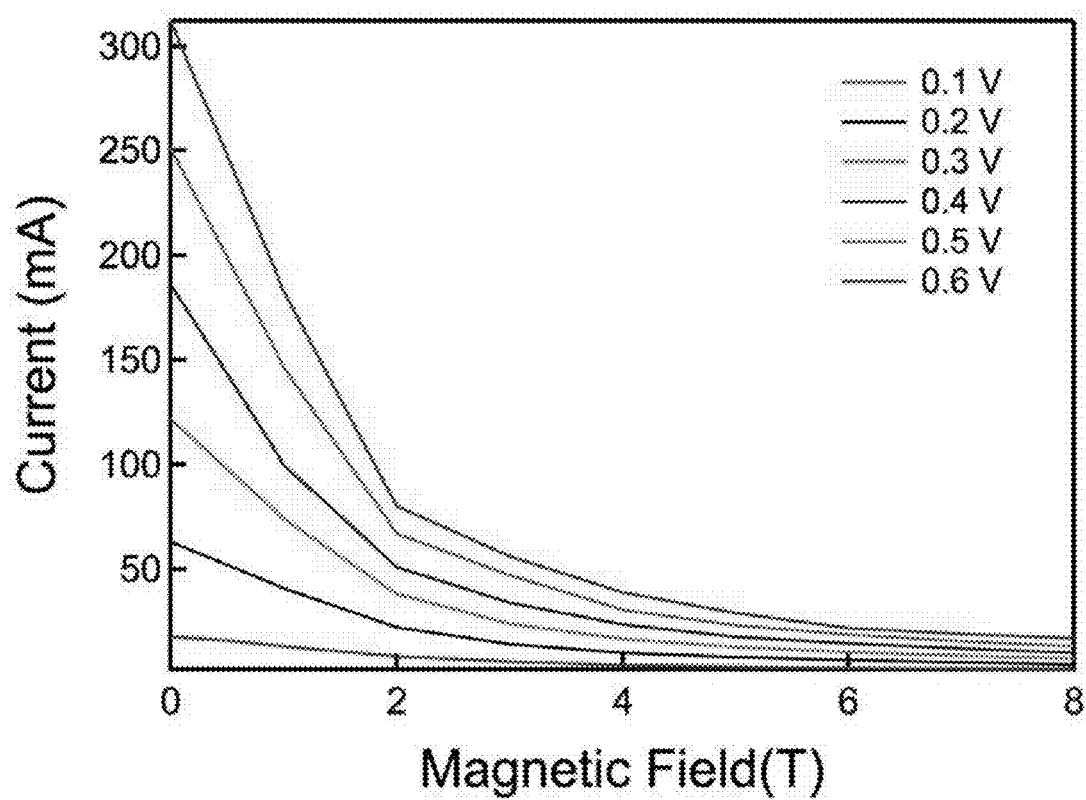
FIG. 2 shows a chart of the InMnAs heterojunction of a spin diode according to one embodiment of the present invention.

FIG. 2 shows a chart of the InMnAs heterojunction of a spin diode according to one embodiment of the present invention. Spin-diode current exponentially increases with voltage and decreases with magnetic field [17]. InMnAs has a Curie temperature of about 330K. Optical measurements have shown that the material has sp-d exchange that leads to the spin splitting of its valence and conduction bands. InMnAs based diodes have shown giant magnetoresistance and a magnetoresistance as high as about 2600% was measured at a magnetic field about 18T and a temperature about 300K. This material has also been used to fabricate the world's first magnetic junction transistor and magneto-amplification effects were demonstrated at room temperature. The advantage of using a magnetic semiconductor based device is the ease of fabrication, integration with present day electronics and the inherent speed advantage.

As discussed above, the logic cell 200 as shown in FIG. 1A and the logic cell 200 as shown in FIG. 1B respectively uses one single spin diode for physical implementations of a logic family, including logic gates such as a logic inverter, a logic NOR gate or a logic XNOR gate. Details of the single diode implementations will be hereinafter described in the following embodiments with reference to FIGS. 3A-5B. In these embodiments, all spin diodes are forward biased.

A logic inverter, also referred to as a logic NOT gate, is a logic gate which implements logical negation. According to the present invention, a logic inverter can be implemented with the logic cell as shown in FIG. 1A or FIG. 1B.

Figure 3A:
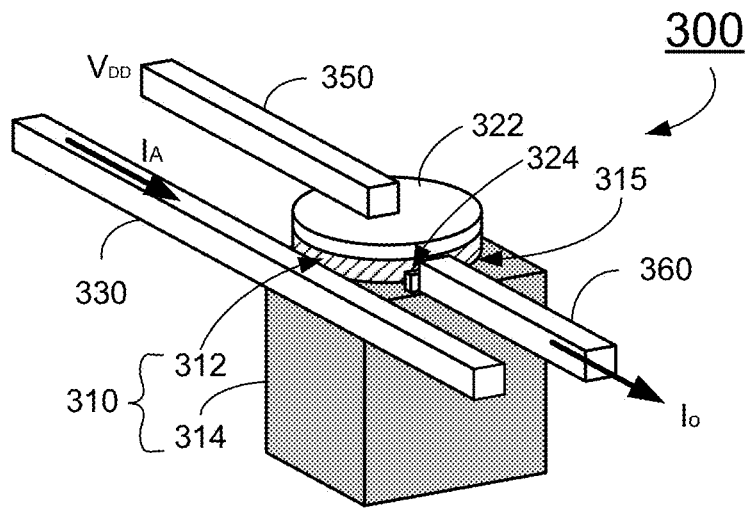
FIG. 3A shows schematically a prospective view of a logic cell according to one embodiment of the present invention, where the logic cell is a logic inverter.
Figure 3B:
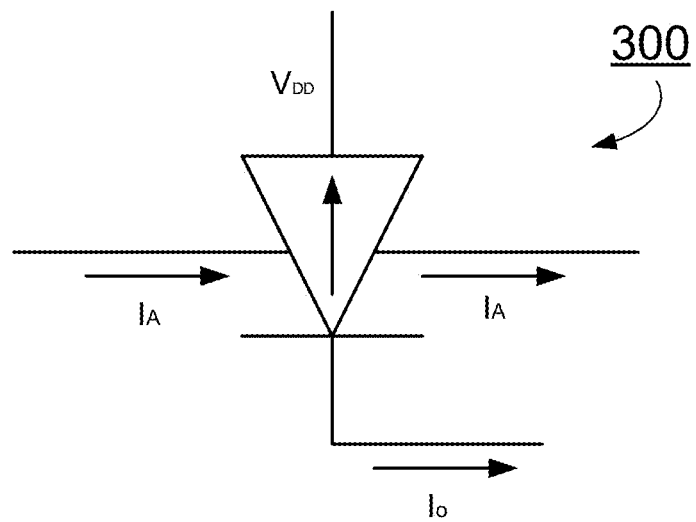
FIG. 3B shows schematically a circuit of the logic cell as shown in FIG. 3A according to one embodiment of the present invention.

Referring to FIGS. 3A and 3B, a logic cell 300 and its circuit are schematically shown according to one embodiment of the present invention, where the logic cell 300 is an implementation of the logic inverter. As shown in FIG. 3A, the logic cell 300 has the same structure as the logic cell 200 as shown in FIG. 1A, including a spin diode 310 having a non-magnetic semiconductor layer 314 and a magnetic semiconductor layer 312, a voltage supply wire 350, a first control wire 330 for receiving a first input current $I_A$, and an output wire 360 for outputting an output current L. Details of the relative positions and connections between these elements have been described above and are hereinafter omitted.

In the logic cell 300, when the first input current $I_A$ flows through the first control wire 330, the first input current $I_A$ induces a first magnetic field $B_1$ greater than the threshold value $B_{th}$ in the spin diode 310 such that the spin diode 310 is in the resistive state for outputting no output current (meaning $I_o=0$) or a relatively low output current (meaning $I_o$ is minimal) through the output wire 360, which represents a logic "0". On the other hand, when no current or a relatively low current flows through the first control wire 330 (meaning $I_A=0$), the magnetic field in the spin diode 310 would be less than the threshold value $B_{th}$ such that the spin diode 310 is in the conductive state for outputting the output current $I_o$ through the output wire 360, which represents a logic "1".

Accordingly, the logic cell 300 corresponds to a logic inverter, where the output wire 360 outputs the logic "1" when the first control wire 330 has no input current ($I_A=0$), and the output wire 360 outputs the logic "0" when the first input current $I_A$ flows through the first control wire 330 ($I_A=1$). Table 1 lists the truth table of the logic inverter.

TABLE 1

A truth table of the logic inverter.

| First Input ($I_A$) | Output ($I_o$) |
|---|---|
| 0 | 1 |
| 1 | 0 |

A logic NOR gate is a logic gate which implements logical NOR operator, which is the result of the negation of the logical OR operator. NOR is a functionally complete operation, which means all other Boolean operations may be implemented exclusively with combination of logic NOR gates. According to the present invention, a logic NOR gate can be implemented with the logic cell as shown in FIG. 1B.

Figure 4A:
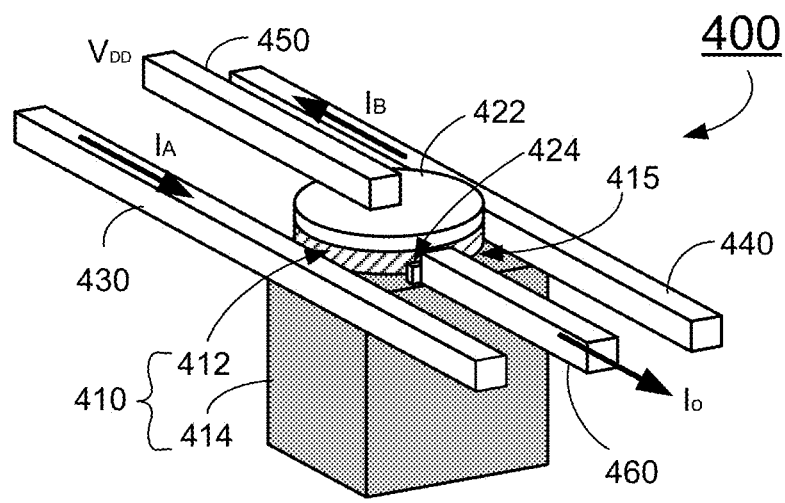
FIG. 4A shows schematically a prospective view of a logic cell according to another embodiment of the present invention, where the logic cell is a logic NOR gate.
Figure 4B:
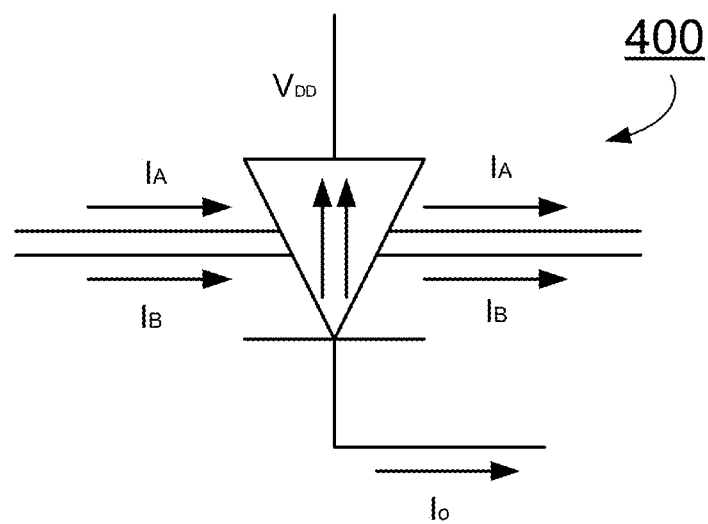
FIG. 4B shows schematically a circuit of the logic cell as shown in FIG. 4A according to one embodiment of the present invention.

Referring to FIGS. 4A and 4B, a logic cell 300 and its circuit is schematically shown according to one embodiment of the present invention, where the logic cell 400 is an implementation of the logic NOR gate. As shown in FIG. 4A, the logic cell 400 has the same structure as the logic cell 200 as shown in FIG. 1B, including a spin diode 410 having a non-magnetic semiconductor layer 414 and a magnetic semiconductor layer 412, a voltage supply wire 450, a first control wire 430 for receiving a first input current $I_A$ and a second control wire 440 for receiving a second input current $I_B$, and an output wire 460 for outputting an output current $I_o$. Details of the relative positions and connections between these elements have been described above and are hereinafter omitted.

As shown in FIG. 4A, the current flows of the first control wire 430 and the second control wire 440 are in the opposite directions. In other words, the second input current $I_B$ is configured to flow through the second control wire 440 in an opposite direction to the first input current $I_A$ flowing in the first control wire 430. Since the first control wire 430 and the second control wire 440 are on two sides of the spin diode 410, the currents flowing through the first control wire 430 and the second control wire 440 would interfere constructively. In particular, when both the first control wire 430 and the second control wire 440 have currents flowing therethrough, the first magnetic field $B_1$ induced by the first input current $I_A$ and the second magnetic field $B_2$ induced by the second input current $I_B$ would be in the same direction in the spin diode 410 (as shown in the circuit symbol of FIG. 4B) such that the first magnetic field $B_1$ induced by the first input current $I_A$ adds to the second magnetic field $B_2$ induced by the second input current $I_B$ to generate an added magnetic field $B_3$, which is further greater than the threshold value in the spin diode 410. Accordingly, the added magnetic field $B_3$ would doubly suppress the spin diode 410 such that the spin diode 410 is in the resistive state for outputting no output current.

In the logic cell 400, when no current (or relatively low currents) flows through the first control wire 430 and the second control wire 440 (meaning $I_A=0$ and $I_B=0$), the magnetic field in the spin diode 410 would be less than the threshold value $B_{th}$ such that the spin diode 410 is in the conductive state for outputting the output current $I_o$ through the output wire 460, which represents a logic "1". When the first input current $I_A$ flows through the first control wire 430 and no current flows through the second control wire 440, the first input current $I_A$ induces the first magnetic field $B_1$ greater than the threshold value $B_{th}$ in the spin diode 410 such that the spin diode 410 is in the resistive state for outputting no output current (meaning $I_o=0$) through the output wire 460, which represents a logic "0". When no current flows through the first control wire 430 and the second input current $I_B$ flows through the second control wire 440, the second input current $I_B$ induces the second magnetic field $B_2$ greater than the threshold value $B_{th}$ in the spin diode 410 such that the spin diode 410 is in the resistive state for outputting no output current through the output wire 460, which represents a logic "0". Further, when the first input current $I_A$ flows through the first control wire 430 and the second input current $I_B$ flows through the second control wire 440, the added magnetic field $B_3$, which is further greater than the threshold value $B_{th}$, is generated in the spin diode 410 such that the spin diode 410 is in the resistive state for outputting no output current through the output wire 460, which represents a logic "0".

Accordingly, the logic cell 400 corresponds to a logic NOR gate, where the output wire 460 outputs the logic "1", when neither the first control wire 430 nor the second control wire 440 have the input current ($I_A=0$ and $I_B=0$), and the output wire 460 outputs the logic "0" when at least one of the first control wire 430 and the second control wire 440 has the input current flowing therethrough. In other words, if at least one of the two input currents $I_A$ and $I_B$ represents "1", the output current $I_o=0$, otherwise the output current $I_o=1$. Table 2 lists the truth table of the logic NOR gate.

TABLE 2

A truth table of the logic NOR gate.

| First Input ($I_A$) | Second Input ($I_B$) | Output ($I_o$) |
|---|---|---|
| 0 | 0 | 1 |
| 0 | 1 | 0 |
| 1 | 0 | 0 |
| 1 | 1 | 0 |

A logic XNOR gate is a logic gate which implements logical XNOR operator, which is the result of the negation of the logical exclusive OR (XOR) operator. According to the present invention, a logic XNOR gate can be implemented with the logic cell as shown in FIG. 1B.

Figure 5A:
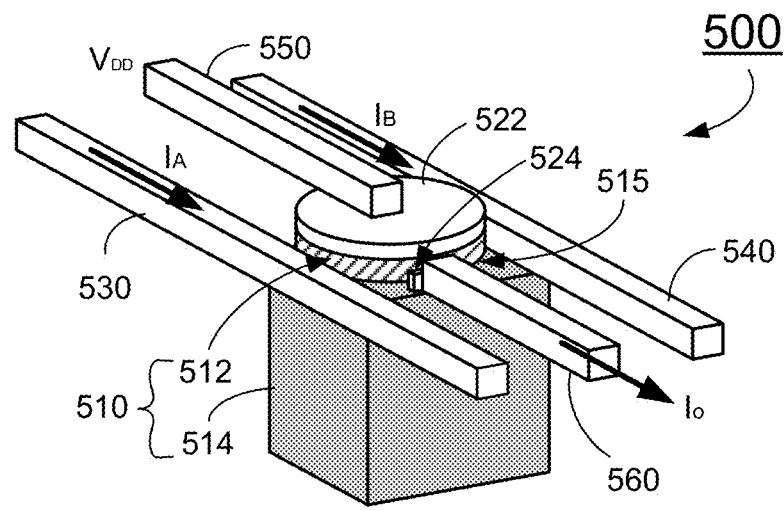
FIG. 5A shows schematically a prospective view of a logic cell according to yet another embodiment of the present invention, where the logic cell is a logic XNOR gate.
Figure 5B:
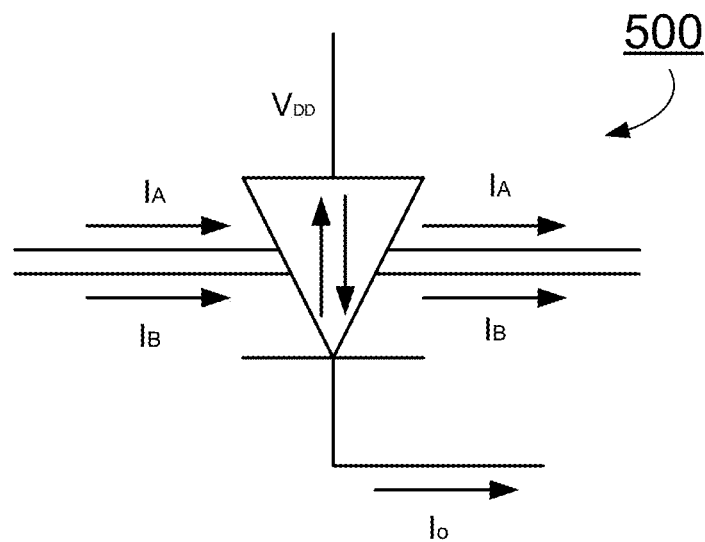
FIG. 5B shows schematically a circuit of the logic cell as shown in FIG. 5A according to one embodiment of the present invention.

Referring to FIGS. 5A and 5B, a logic cell 500 and its circuit are schematically shown according to one embodiment of the present invention, where the logic cell 500 is an implementation of the logic XNOR gate. As shown in FIG. 5A, the logic cell 500 has the same structure as the logic cell 200 as shown in FIG. 1B, including a spin diode 510 having a non-magnetic semiconductor layer 514 and a magnetic semiconductor layer 512, a voltage supply wire 550, a first control wire 530 for receiving a first input current $I_A$ and a second control wire 540 for receiving a second input current $I_B$, and an output wire 560 for outputting an output current $I_o$. Details of the relative positions and connections between these elements have been described above and are hereinafter omitted.

Although the structure of the logic cell 500 as shown in FIG. 5A is identical to the logic cell 400 as shown in FIG. 4A, the current flows of the control wires in the logic cells of the two embodiments are different. As shown in FIG. 5A, the current flows of the first control wire 530 and the second control wire 540 are in the same directions. In other words, the second input current $I_B$ is configured to flow through the second control wire 540 in the same direction as the first input current $I_A$ flowing in the first control wire 530. Since the first control wire 530 and the second control wire 540 are on two sides of the spin diode 510, the currents flowing through the first control wire 530 and the second control wire 540 would interfere destructively. In particular, when both the first control wire 530 and the second control wire 540 have currents flowing therethrough, the first magnetic field $B_1$ induced by the first input current $I_A$ and the second magnetic field $B_2$ induced by the second input current $I_B$ would be in the opposite direction in the spin diode 510 (as shown in the circuit symbol of FIG. 5B) such that the first magnetic field $B_1$ induced by the first input current $I_A$ nullifies the second magnetic field $B_2$ induced by the second input current $I_B$ to generate a subtracted magnetic field $B_4$, which is less than the threshold value $B_{th}$ in the spin diode 510. Accordingly, the subtracted magnetic field $B_4$ would allow current to flow through the spin diode 510 such that the spin diode 510 is in the conductive state for outputting the output current $I_o$.

In the logic cell 500, when no current (or relatively low currents) flows through the first control wire 530 and the second control wire 540 (meaning $I_A=0$ and $I_B=0$), the magnetic field in the spin diode 510 would be less than the threshold value $B_{th}$ such that the spin diode 510 is in the conductive state for outputting the output current $I_o$ through the output wire 560, which represents a logic "1". When the first input current $I_A$ flows through the first control wire 530 and no current flows through the second control wire 540, the first input current $I_A$ induces the first magnetic field $B_1$ greater than the threshold value $B_{th}$ in the spin diode 510 such that the spin diode 510 is in the resistive state for outputting no output current (meaning $I_o=0$) through the output wire 560, which represents a logic "0". When no current flows through the first control wire 530 and the second input current $I_B$ flows through the second control wire 540, the second input current $I_B$ induces the second magnetic field $B_2$ greater than the threshold value $B_{th}$ in the spin diode 510 such that the spin diode 510 is in the resistive state for outputting no output current through the output wire 560, which represents a logic "0". Further, when the first input current $I_A$ flows through the first control wire 530 and the second input current $I_B$ flows through the second control wire 540 (meaning $I_A=1$ and $I_B=1$), the subtracted magnetic field $B_4$, which is less than the threshold value $B_{th}$, is generated in the spin diode 510 such that the spin diode 510 is in the conductive state for outputting the output current $I_o$ through the output wire 560, which represents a logic "1".

Accordingly, the logic cell 500 corresponds to a logic XNOR gate, where the output wire 560 outputs the logic "1" when neither or both the first control wire 530 and the second control wire 540 have the input current, and the output wire 560 outputs the logic "0" when exactly one of the first control wire 530 and the second control wire 540 has the input current flowing therethrough. In other words, if exactly one of the two input currents $I_A$ and $I_B$ represents "1", the output current $I_o=0$, otherwise the output current $I_o=1$. Table 3 lists the truth table of the logic XNOR gate.

TABLE 3

A truth table of the logic XNOR gate.

| First Input ($I_A$) | Second Input ($I_B$) | Output ($I_o$) |
|---|---|---|
| 0 | 0 | 1 |
| 0 | 1 | 0 |
| 1 | 0 | 0 |
| 1 | 1 | 1 |

As discussed above, the logic cell 500 corresponds to a logic XNOR gate. Since the logic cell 500 utilizes a single spin diode to implement the logic XNOR gate, it is significantly more compact than the standard XNOR gate implementation, which requires 10 CMOS devices.

Figure 6:
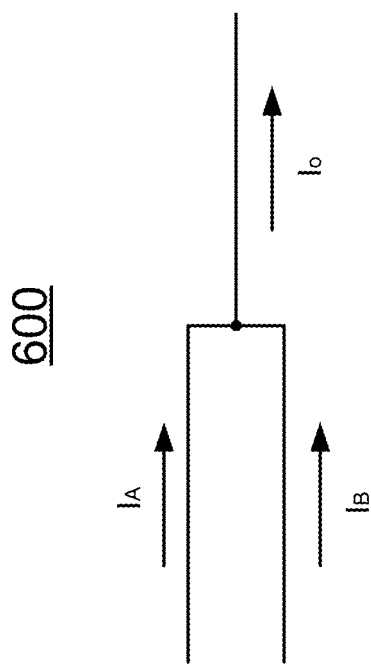
FIG. 6 shows schematically a circuit of a logic OR gate according to one embodiment of the present invention.

In comparison to the logic gates described in the embodiments as discussed above, a logic OR gate, which is a logic gate that implements logical disjunction, may be physically constructed simply by merging two wires without using any spin diode. Thus, by placing the logic OR gate as an input to another logic gate, logical functions with more than two inputs can be implemented. FIG. 6 shows schematically a circuit of a logic OR gate according to one embodiment of the present invention, where two input wires merge into an output wire to form the logic OR gate 600. When no current flows through any of the two input wires (meaning $I_A=0$ and $I_B=0$), there is no output current (meaning $I_o=0$) through the output wire, which represents a logic "0". When one or both of the two input wires has an input current $I_A$ and/or $I_B$, the output wire has a cumulative output current $I_o$, which represents a logic "1". In other words, if both of the two input currents $I_A$ and $I_B$ represents "0", the output current $I_o=0$, otherwise the output current $I_o=1$. Table 4 lists the truth table of the logic OR gate.

TABLE 4

A truth table of the logic OR gate.

| First Input ($I_A$) | Second Input ($I_B$) | Output ($I_o$) |
|---|---|---|
| 0 | 0 | 0 |
| 0 | 1 | 1 |
| 1 | 0 | 1 |
| 1 | 1 | 1 |

The four basis logic cells, as discussed above, can be arranged to implement any logical circuit with multiple spin diodes. Examples of the logical circuits include a one-bit full adder, a logic latch, or other logical circuits. Details of the multiple spin diodes implementations will be hereinafter described in the following embodiments with reference to FIGS. 7-8.

A logic adder, sometimes referred to as a logic summer, is a digital circuit that performs addition of numbers. A full adder adds binary numbers and accounts for values carried in as well as out. A one-bit full adder adds three one-bit numbers, often referred to as A, B, and $C_{in}$, and generates two one-bit output numbers, often referred to as the sum output (S) and the carry-out output ($C_{out}$). According to the present invention, a logic one-bit full adder can be implemented with six spin diodes, including one spin diode as the logic inverter, three spin diodes as the logic NOR gates, and two spin diodes as the logic XNOR gates. Further, a plurality of logic OR gates 600 as shown in FIG. 6 are also used to form the one-bit full adder.

Figure 7:
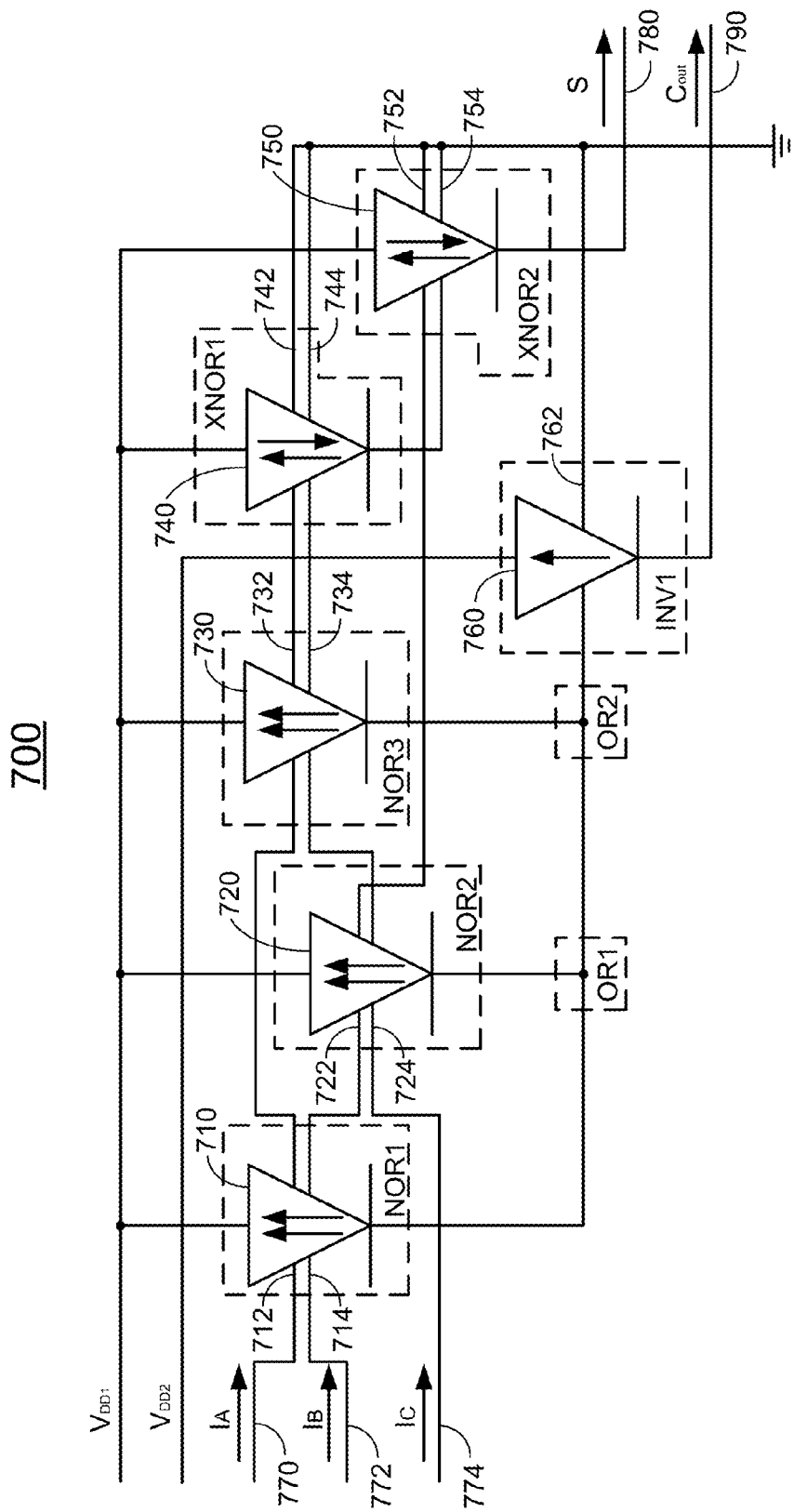
FIG. 7 shows schematically a circuit of a logic cell according to one embodiment of the present invention, where the logic cell is a one-bit full adder.

FIG. 7 shows schematically a circuit of a logic cell according to one embodiment of the present invention, where the logic cell 700 is an implementation of a logic one-bit full adder. As shown in FIG. 7, the logic cell 700 includes six spin diodes 710, 720, 730, 740, 750 and 760, and three input terminals 770, 772 and 774 for receiving three input currents $I_A$, $I_B$ and $I_C$, which refers to the three one-bit numbers of A, B and $C_{in}$, respectively. The six spin diodes include a first spin diode 710, a second spin diode 720, a third spin diode 730, a fourth spin diode 740, a fifth spin diode 750, and a sixth spin diode 760. Each of the six spin diodes has a cathode and an anode. As shown in FIG. 7, the anodes of the first, second, third, fourth and fifth spin diodes 710, 720, 730, 740 and 750 are all connected to a first voltage supply for providing a first supply voltage, $V_{DD1}$, and the anode of the sixth spin diode 760 is connected to a second voltage supply for providing a second supply voltage, $V_{DD2}$.

As described above, each spin diode is configured such that under a forward bias, when a magnetic field applied to the spin diode is less than a threshold value, the spin diode is in a conductive state in which electric current flows through the spin diode, and when the magnetic field applied to the spin diode is greater than the threshold value, the spin diode is in a resistive state in which the electric current flowing through the spin diode is substantially reduced.

Each of the first, second, third, fourth and fifth spin diodes 710, 720, 730, 740 and 750 has the structure as shown in FIG. 1B, which include two control wires. Specifically, the first spin diode 710 has a first control wire 712 and a second control wire 714 oriented in parallel and positioned on two sides of the first spin diode 710, the second spin diode 720 has a first control wire 722 and a second control wire 724 oriented in parallel and positioned on two sides of the second spin diode 720, the third spin diode 730 has a first control wire 732 and a second control wire 734 oriented in parallel and positioned on two sides of the third spin diode 730, the fourth spin diode 740 has a first control wire 742 and a second control wire 744 oriented in parallel and positioned on two sides of the fourth spin diode 740, and the fifth spin diode 750 has a first control wire 752 and a second control wire 754 oriented in parallel and positioned on two sides of the fifth spin diode 750. Thus, for each of the first, second, third, fourth and fifth spin diodes 710, 720, 730, 740 and 750, when a control current flows through one of the first and second control wires, the control current induces a magnetic field greater than the threshold value in the spin diode.

For each of the first, second and third spin diodes 710, 720 and 730, the second control current is configured to flow through the second control wire in an opposite direction to the first control current flowing in the first control wire. Thus, for the first spin diode 710, when the first control current flows through the first control wire 712 and the second input current flows through the second control wire 714 simultaneously, the first magnetic field induced by the first control current adds to the second magnetic field induced by the second control current to generate an added magnetic field greater than the threshold value in the first spin diode, thereby implementing a logic NOR gate NOR1. Similarly, the second spin diode 720 implements a logic NOR gate NOR2, and the third spin diode 730 implements a logic NOR gate NOR3.

For each of the fourth and fifth spin diodes 740 and 750, the second control current is configured to flow through the second control wire in the same direction as the first control current flowing in the first control wire. Thus, for the fourth spin diode 740, when the first control current flows through the first control wire 742 and the second control current flows through the second control wire 744 simultaneously, the first magnetic field induced by the first control current nullifies the second magnetic field induced by the second control current to generate a subtracted magnetic field less than the threshold value in the fourth spin diode, thereby implementing a logic XNOR gate XNOR1. Similarly, the fifth spin diode 750 implements a logic XNOR gate XNOR2.

The sixth diode 760 has the structure as shown in FIG. 1A, which includes a control wire 762 positioned on one side of the sixth spin diode 760. Thus, when a control current flows through the control wire 762 of the sixth spin diode 760, the control current induces a magnetic field greater than the threshold value in the sixth spin diode 760, thereby implementing a logic inverter INV1.

Further, each control wire of the spin diodes 710, 720, 730, 740, 750 and 760 has a first end and the second end. As shown in FIG. 7, for each spin diode, the first end of each control wire is on the left side of the figure, and the second end of each control wire is on the right side of the figure. It should be appreciated that, for each of the first, second, third, fourth and fifth spin diodes 710, 720, 730, 740 and 750, although FIG. 7 shows that all first ends of the first and second control wires are on the left side of each spin diode and all second ends of the first and second control wires are on the right side of each spin diode, actual physical implementations of the control wires of the spin diodes may vary. For example, the first, second and third spin diodes 710, 720 and 730 are used for implementing logic NOR gates. Thus, as shown in FIG. 4A, in the implementation of a logic NOR gate, the first end of the first control wire 430 and the first end of the second control wire 440 may be on the opposite sides of the spin diode 400. In contrast, the fourth and fifth spin diodes 740 and 750 are used for implementing logic XNOR gates. Thus, as shown in FIG. 5A, in the implementation of a logic XNOR gate, the first end of the first control wire 530 and the first end of the second control wire 540 may be on the same side of the spin diode 500.

As shown in FIG. 7, the second end of the first control wire 712 of the first spin diode 710 is electrically connected to the first end of the first control wire 732 of the third spin diode 730. The second end of the second control wire 714 of the first spin diode 710 is electrically connected to the first end of the first control wire 722 of the second spin diode 720. The second end of the first control wire 722 of the second spin diode 720 is electrically connected to the first end of the first control wire 752 of the fifth spin diode 750. The second end of the second control wire 724 of the second spin diode 720 is electrically connected to the first end of the second control wire 734 of the third spin diode 730. The second end of the first control wire 732 of the third spin diode 730 is electrically connected to the first end of the first control wire 742 of the fourth spin diode 740. The second end of the second control wire 734 of the third spin diode 730 is electrically connected to the first end of the second control wire 744 of the fourth spin diode 740. The cathodes of the first, second and third spin diodes 710, 720 and 730 are electrically connected to the first end of the control wire 762 of the sixth spin diode 760. The cathode of the fourth spin diode 740 is electrically connected to the first end of the second control wire 754 of the fifth spin diode 750. The second ends of the first and second control wires 742 and 744 of the fourth spin diode 740, the first and second control wires 752 and 754 of the fifth spin diode 750, and the control wire 762 of the sixth spin diode 760 are all grounded.

The three input terminals includes the first input terminal 770, the second input terminal 772, and the third input terminal 774. As shown in FIG. 7, the first input terminal 770 is electrically connected to the first end of the first control wire 712 of the first spin diode 710 for providing a first input current, $I_A$. The second input terminal 772 is electrically connected to the first end of the second control wire 714 of the first spin diode 710 for providing a second input current, $I_B$. The third input terminal 774 is electrically connected to the first end of the second control wire 724 of the second spin diode 720 for providing a third input current, $I_C$. Thus, the first input current $I_A$ would be provided to the first control wire 712 of the first spin diode 710, the first control wire 732 of the third spin diode 730, and the first control wire 742 of the fourth spin diode 740. Thus, when the first input terminal 770 receives the first input current $I_A$, the first input current $I_A$ would be provided to the first control wire 712 of the first spin diode 710, the first control wire 732 of the third spin diode 730, and the first control wire 742 of the fourth spin diode 740. When the second input terminal 772 receives the second input current $I_B$, the second input current $I_B$ would be provided to the second control wire 714 of the first spin diode 710, the first control wire 722 of the second spin diode 720, and the first control wire 752 of the fifth spin diode 750. When the third input terminal 774 receives the third input current $I_C$, the third input current $I_C$ would be provided to the second control wire 724 of the second spin diode 720, the second control wire 734 of the third spin diode 730, and the second control wire 744 of the fourth spin diode 740.

The logic cell 700 further includes a sum output terminal 780 and a carry-out output terminal 790. The sum output terminal 780 is electrically connected to the cathode of the fifth spin diode 750 for outputting a sum output signal S of a logic "0" or "1" responsive to the first input current $I_A$, the second input current $I_B$, and the third input current $I_C$. The carry-out output terminal 790 is electrically connected to the cathode of the sixth spin diode 760 for outputting a carry-out output signal $C_{out}$ of the logic "0" or "1" responsive to the first input current $I_A$, the second input current $I_B$, and the third input current $I_C$.

In operation, the logic XNOR gate XNOR1 implemented by the fourth spin diode 740 is controlled by the first input current $I_A$ and the third input current $I_C$, and the logic XNOR gate XNOR2 implemented by the fifth spin diode 750 is controlled by the second input current $I_B$ and the output current of the fourth spin diode 740. The output current of the fifth spin diode 750 becomes the sum output signal S.

As described above, for a logic XNOR gate, the output current is the logic "0" when exactly one of the two input currents represents the logic "1", otherwise the output current is "1". Thus, the sum output terminal 780 is configured to output the logic "0" as the sum output signal S when no input current is provided by any of the first, second and third input terminals 770, 772 and 774, or when exactly two of the first input current $I_A$, the second input current $I_B$, and the third input current $I_C$ are provided by the first, second and third input terminals 770, 772 and 774, and to output the logic "1" as the sum output signal S when exactly one of the first input current $I_A$, the second input current $I_B$, and the third input current $I_C$ is provided by the first, second and third input terminals 770, 772 and 774, or when all of the first input current $I_A$, the second input current $I_B$, and the third input current $I_C$ are provided by the first, second and third terminals 770, 772 and 774, respectively. Details of the relationships between the sum output signal S and the first, second and third input currents $I_A$, $I_B$ and $I_C$ will be further discussed later.

Further, in operation, the three logic NOR gates NOR1, NOR2 and NOR3 implemented by the first, second and third spin diodes 710, 720 and 730 are respectively controlled by the three pairs of input currents ($I_A$, $I_B$), ($I_A$, $I_C$) and ($I_B$, $I_C$). The output currents of the three logic NOR gates NOR1, NOR2 and NOR3 implemented by the first, second and third spin diodes 710, 720 and 730 form a cumulative control current by the logic OR gates OR1 and OR2 as shown in FIG. 7, and the logic inverter INV1 implemented by the sixth spin diode 760 is controlled by the cumulative control current. The output current of the sixth spin diode 760 becomes the carry-out output signal $C_{out}$.

As described above, for a logic NOR gate, the output current is the logic "0" when at least one of the two control currents represents "1", otherwise the output current is "1". Thus, the carry-out output terminal 790 is configured to output the logic "0" as the carry-out output signal $C_{out}$ when no input current flows through any of the first, second and third input wires 770, 772 and 774, or when exactly one of the first input current $I_A$, the second input current $I_B$, and the third input current $I_C$ is provided by the first, second and third input terminals 770, 772 and 774, and to output the logic "1" as the carry-out output signal $C_{out}$ when exactly two of the first input current $I_A$, the second input current $I_B$, and the third input current $I_C$ are provided by the first, second and third input terminals 770, 772 and 774, or when all of the first input current $I_A$, the second input current $I_B$, and the third input current $I_C$ are provided by the first, second and third terminals 770, 772 and 774, respectively. Details of the relationships between the carry-out output signal $C_{out}$ and the first, second and third input currents $I_A$, $I_B$ and $I_C$ will be further discussed later.

Table 5 lists the truth table of the logic one-bit full adder. Details of the relationship between the sum output signal S, the carry-out output signal $C_{out}$ and the three input currents $I_A$, $I_B$ and $I_C$ of the three control terminals 770, 772 and 774 are listed in Table 5. The output of each logic gate implemented by the spin diodes are also listed in Table 5.

TABLE 5

A truth table of the logic one-bit full adder.

| Input $I_A$ | Input $I_B$ | Input $I_C$ | XNOR1 | Output S (XNOR2) | NOR1 | NOR2 | NOR3 | Output $C_{out}$ (INV1) |
|---|---|---|---|---|---|---|---|---|
| 0 | 0 | 0 | 1 | 0 | 1 | 1 | 1 | 0 |
| 0 | 0 | 1 | 0 | 1 | 1 | 0 | 0 | 0 |
| 0 | 1 | 0 | 1 | 1 | 0 | 0 | 1 | 0 |
| 0 | 1 | 1 | 0 | 0 | 0 | 0 | 0 | 1 |
| 1 | 0 | 0 | 0 | 1 | 0 | 1 | 0 | 0 |
| 1 | 0 | 1 | 1 | 0 | 0 | 0 | 0 | 1 |

TABLE 5-continued

A truth table of the logic one-bit full adder.

| Input $I_A$ | Input $I_B$ | Input $I_C$ | XNOR1 | Output S (XNOR2) | NOR1 | NOR2 | NOR3 | Output $C_{out}$ (INV1) |
|---|---|---|---|---|---|---|---|---|
| 1 | 1 | 0 | 0 | 0 | 0 | 0 | 0 | 1 |
| 1 | 1 | 1 | 1 | 1 | 0 | 0 | 0 | 1 |

As shown in Table 5, the logic style of the two outputs ($C_{out}$, S) and the three inputs (A, B, $C_{in}$), which represents the three input currents $I_A$, $I_B$ and $I_C$, may be shown as:

$$C_{out} = (A \wedge B) \vee (A \wedge C_{in}) \vee (B \wedge C_{in}) = \overline{\overline{A \vee B} \vee \overline{A \vee C_{in}} \vee \overline{B \vee C_{in}}} \quad (1)$$

$$\text{Sum} = A \oplus B \oplus C_{in} = \overline{\overline{A \oplus B \oplus C_{in}}} \quad (2)$$

As discussed above, according to the present invention, the logic one-bit full adder can be implemented with six spin diodes. Thus, the logic one-bit full adder is far more compact than the typical CMOS implementation of the one-bit full adder, which requires 28 transistors, and simplifies the fabrication process.

A logic latch, sometimes referred to as a logic flip-flop, is a digital circuit that has two different states and can be used to store state information. The logic latch is the basic storage element in sequential logic. A logic latch generally can be made to change state by signals applied to one or more control inputs, and will have one or two outputs. A simple set-reset (S-R) latch can be implemented with two logic NOR gates. According to the present invention, a logic latch can be implemented with two spin diodes the logic NOR gates.

Figure 8:
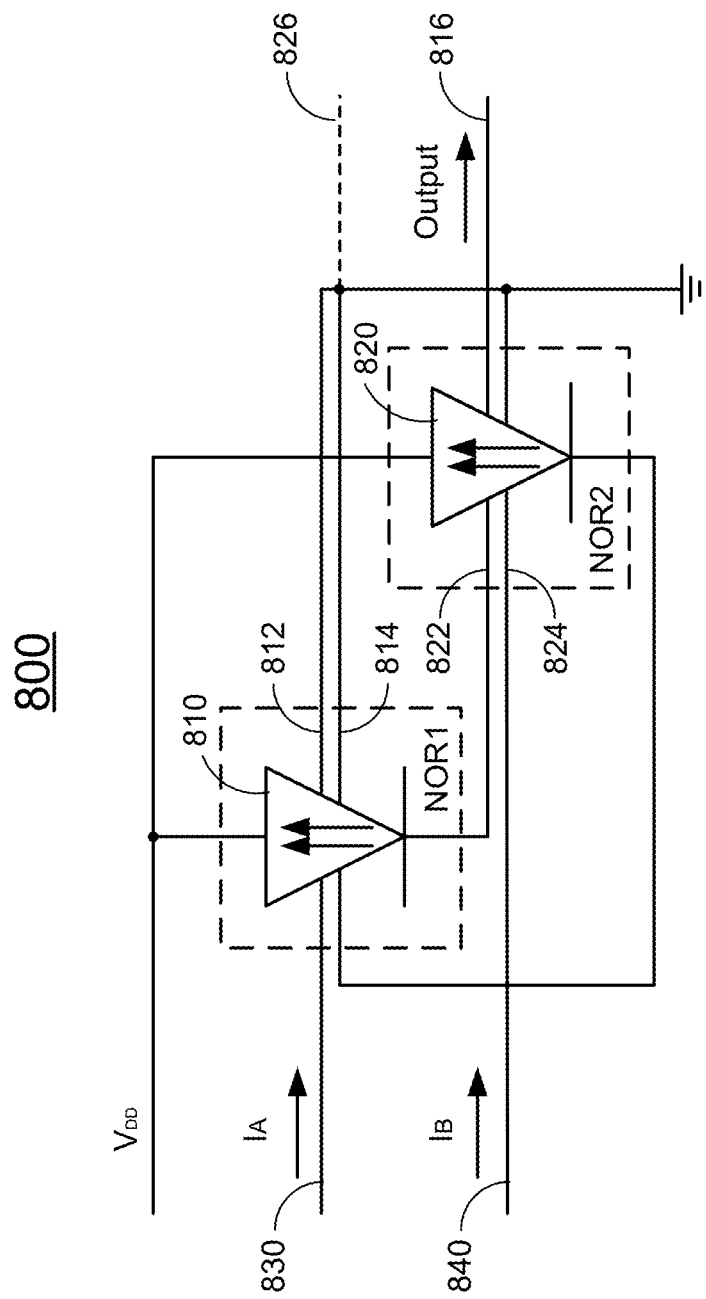
FIG. 8 shows schematically a circuit of a logic cell according to one embodiment of the present invention, where the logic cell is a logic latch.

FIG. 8 shows schematically a circuit of a logic cell according to one embodiment of the present invention, where the logic cell 800 is a logic latch. As shown in FIG. 8, the logic cell 800 includes two spin diodes 810 and 820, two input terminals 830 and 840, and a first output terminal 816.

The two spin diodes include a first spin diode 810 and a second spin diode 820, which have the structures as shown in FIG. 1B. Specifically, the first spin diode 810 includes a cathode, an anode, and a first control wire 812 and a second control wire 814 oriented in parallel and positioned on two sides of the first spin diode 810. The second spin diode 820 includes a cathode, an anode, and a third control wire 822 and a fourth control wire 824 oriented in parallel and positioned on two sides of the second spin diode 820. The anodes of the first and second spin diodes 810 and 820 are connected to a voltage supply for providing a supply voltage, $V_{DD}$. Each of the first and second spin diodes 810 and 820 is configured such that under a forward bias, when a magnetic field applied to the spin diode is less than a threshold value, the spin diode is in a conductive state in which electric current flows through the spin diode, and when the magnetic field applied to the spin diode is greater than the threshold value, the spin diode is in a resistive state in which the electric current flowing through the spin diode is substantially reduced.

For each of the first and second spin diode 810 and 820, when a control current flows through one of the first and second control wires, the control current induces a magnetic field greater than the threshold value in the spin diode. Further, when a first control current flows through the first control wire in an opposite direction to a second control current flowing through the second control wire simultaneously, the first magnetic field induced by the first control current adds to the second magnetic field induced by the second control current to generate an added magnetic field greater than the threshold value in the spin diode, thereby implementing a logic NOR gate. Thus, the first spin diode 810 implements a first logic NOR gate NOR1, and the second spin diode 820 implements a second logic NOR gate NOR2.

Further, each control wire of the first and second spin diodes 810 and 820 has a first end and a second end. As shown in FIG. 8, for each spin diode, the first end of each control wire is on the left side of the figure, and the second end of each control wire is on the right side of the figure. It should be appreciated that, for each of the first and second spin diodes 810 and 820, although FIG. 8 shows that all first ends of the first and second control wires are on the left side of each spin diode and all second ends of the first and second control wires are on the right side of each spin diode, actual physical implementations of the control wires of the spin diodes may vary. For example, the first and second spin diodes 810 and 820 are used for implementing logic NOR gates. Thus, as shown in FIG. 4A, in the implementation of a logic NOR gate, the first end of the first control wire 430 and the first end of the second control wire 440 may be on the opposite sides of the spin diode 400.

As shown in FIG. 8, the cathode of the first spin diode 810 is electrically connected to the first end of the first control wire 822 of the second spin diode, and the cathode of the second spin diode 820 is electrically connected to the first end of the second control wire 814 of the first spin diode 810.

The two input terminals include a first input terminal 830 and a second input terminal 840. The first input terminal 830 is connected to a first end of the first control wire 812 of the first spin diode 810 for providing a first input current, $I_A$, and the second input terminal 840 is connected to a first end of the second control wire 824 of the second spin diode 820 for providing a second input current, $I_B$. The first output terminal 816 is electrically connected to the second end of the first control wire 822 of the second spin diode 820 for outputting a logic "0" or "1" responsive to the first input current $I_A$ and the second input current $I_B$. The second ends of the first and second control wires 812 and 814 of the first spin diode 810 and the second end of the second control wire 824 of the second spin diode 820 are grounded.

As shown in FIG. 8, the output current of each spin diode is routed to the other spin diode to provide control of the spin diodes 810 and 820. Thus, the first logic NOR gate NOR1 implemented by the first spin diode 810 is controlled by the first input current $I_A$ and the output current of the second spin diode 820, and the second logic NOR gate NOR2 implemented by the second spin diode 820 is controlled by the second input current $I_B$ and the output current of the first spin diode 810.

Thus, in this embodiment, for the output signal of the first output terminal 816, the second control terminal 840 serves as the set terminal, and the first control terminal 830 serves as the reset terminal, such that when the first input current $I_A$ is provided by the first input terminal 830, the output of the logic cell 800 through the first output terminal 816 is reset to be the logic "0", and when the second input current $I_B$ is provided by the second input terminal 840, the output of the logic cell 800 through the first output terminal 816 is set to be the logic "1". When no input current is provided by the first and second input terminals 830 and 840, the output of the logic cell 800 through the first output terminal 816 remains the same.

Table 6 lists the truth table of the logic latch. It should be noted that Table 6 shows the one-output logic latch, with the first output terminal 816 being the only output of the logic latch, as shown in FIG. 8. Further, when there are input currents flowing through both of the first control terminal 830 and the second control terminal 840, a restricted combination or a forbidden state occurs, where outputs of both logic NOR gates NOR1 and NOR2 become the logic "0"s. The latch output would then lock at either the logic "1" or "0", depending on the propagation time relations between the NOR gates, resulting in a race condition. Thus, the restricted combination is generally not allowed in the S-R logic latch.

TABLE 6

A truth table of the logic latch.

| $I_A$ | $I_B$ | Action | Output$_{next}$ |
|---|---|---|---|
| 0 | 0 | Hold state | Same Output |
| 0 | 1 | Set | 1 |
| 1 | 0 | Reset | 0 |
| 1 | 1 | (not allowed) | X |

It should be appreciated that the logic cell 800 serves as a logic latch, which generally has at least one output terminals. In other words, the logic cell 800 may have one output or two output terminals. In certain embodiments, a second output terminal 826 (the dotted line as shown in FIG. 8) may be provided. The second output terminal 826, if provided, is electrically connected to the second end of the second control wire 814 of the first spin diode 810 for outputting the logic "0" or "1" responsive to the first input current $I_A$ and the second input current $I_B$. In this case, the second end of the second control wire 814 of the first spin diode 810 is not grounded.

When the second output terminal 826 is provided, the first control terminal 830 serves as the set terminal for the second output terminal 826, and the second control terminal 840 serves as the reset terminal for the second output terminal 826, such that when the first input current $I_A$ is provided by the first input terminal 830, the output of the logic cell 800 through the second output terminal 826 is set to be the logic "1", and when the second input current $I_B$ is provided by the second input terminal 840, the output of the logic cell 800 through the second output terminal 826 is reset to be the logic "0". When no input current is provided by the first and second input terminals 830 and 840, the output of the logic cell 800 through the second output terminal 826 remains the same.

As discussed above, according to the present invention, the logic latch can be implemented with two spin diodes to create stable memory storage. Thus, the fabrication process thereof may be simplified.

In certain aspects of the invention, a logic array or apparatus may be formed utilizing at least one logic cell as disclosed above.

In summary, the present invention, among other things, recites spin diode based logic that utilizes the magnetoresistance of spin diodes to operate the logic from one logic gate to another logic gate. Changing a gate using magnetic fields that are generated using input currents creates many unique capabilities. The unique capabilities will lead to field devices where simple instructions can be used to construct a whole new set of logic gates.

The introduction of magnetoresistive semiconductor diodes makes possible the invention of a diode logic family providing significant improvements over CMOS. According to the present invention, spin-diode logic can be exploited to use fewer devices than comparable CMOS circuits, potentially resulting in increased speed and density without the excessive power and manufacturing complexity caused by Si transistor scaling. Spin-diode logic not only has advantages for particular specialized circuits, but for logic in general. These devices and the accompanying logic family have the potential to replace CMOS and thereby become the building blocks of future computing systems.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

LIST OF REFERENCES

[1] J. D. Meindl, Q. Chen, J. A. Davis, Limits on silicon nanoelectronics for terascale integration, *Science* 293, 2044-2049 (2001).

[2] D. J. Frank et al., Device scaling limits of Si MOSFETs and their application dependencies. *Proc. IEEE* 89, 259-288 (2001).

[3] K. Bernstein, R. K. Cavin, W. Porod, A. Seabaugh, J. Welser, Device and architecture outlook for beyond CMOS switches. *Proc. IEEE* 98, 2169-2184 (2010).

[4] R. H. Chen, A. N. Korotkov, K. K. Likharev, Single-electron transistor logic. *Appl. Phys. Lett.* 68, 1954-1956 (1996).

[5] A. Bachtold, P. Hadley, T. Nakanishi, C. Dekker, Logic circuits with carbon nanotube transistors. *Science* 294, 1317-1320 (2001).

[6] A. Geim, K. Novoselov, The rise of graphene. *Nature Materials* 6, 183-191 (2007).

[7] L. Liao et al., High-speed graphene transistors with a self-aligned nanowire gate. *Nature* 467, 305-308 (2010).

[8] Y. Huang et al., Logic gates and computation from assembled nanowire building blocks. *Science* 294, 1313-1317 (2001).

[9] C. P. Collier et al., Electronically configurable molecular-based logic gates. *Science* 285, 391-394 (1999).

[10] S. Datta, B. Das, Electronic analog of the electro-optic modulator. *Appl. Phys. Lett.* 56, 665-667 (1990).

[11] I. Amlani et al., Digital logic gate using quantum-dot cellular automata. *Science* 284, 289-291 (1999).

[12] A. Ney, C. Pampuch, R. Koch, K. H. Ploog, Programmable computing with a single magnetoresistive element. *Nature* 425, 485-487 (2003).

[13] D. A. Allwood et al., Magnetic domain-wall logic. *Science* 309, 1688-1692 (2005).
[14] A. Khitun, K. L. Wang, Nano scale computational architectures with spin wave bus. *Superlattices and Microstructures* 38, 184-200 (2005).
[15] S. J. May, B. W. Wessels, High-field magnetoresistance in p-(In,Mn)As/n-InAs heterojunctions. *Appl. Phys. Lett.* 88, 072105 (2006).
[16] A. Imre et al., Majority logic gate for magnetic quantum-dot cellular automata. *Science* 311, 205-208 (2006).
[17] N. Rangaraju, P. C. Li, B. W. Wessels, Giant magnetoresistance of magnetic semiconductor heterojunctions. *Phys. Rev. B* 79, 205-209 (2009).
[18] S. Sugahara, J. Nitta, Spin-transistor electronics: an overview and outlook. *Proc. IEEE* 98, 2124-2154 (2010).
[19] S. A. Wolf, J. Lu, M. R. Stan, E. Chen, D. M. Treger, The promise of nanomagnetics and spintronics for future logic and universal memory. *Proc. IEEE* 98, 2155-2168 (2010).
[20] J. A. Peters, N. Rangaraju, C. Feeser, B. W. Wessels, Spin-dependent magnetotransport in a p-InMnSb/n-InSb magnetic semiconductor heterojunction. *Appl. Phys. Lett.* 98, 193506 (2011).
[21] F. M. Wanlass, Low stand-by power complementary field effect circuitry. U.S. Pat. No. 3,356,858 (1967).
[22] R. H. Katz, *Contemporary Logic Design* (Benjamin/Cummings, Redwood City, Calif., 1994), pp. 669-670.
[23] I. Zutic, J. Fabian, S. D. Sarma, Spin-polarized transport in inhomogeneous magnetic semiconductors: theory of magnetic/nonmagnetic p-n junctions. *Phys. Rev. Lett.* 88, 066603 (2002).
[24] J. Sklansky, Conditional-sum addition logic. *IRE Transactions on Electronic Computers* 9, 226-231 (1960).

What is claimed is:

1. A logic cell, comprising:
(a) a spin diode having a non-magnetic semiconductor layer and a magnetic semiconductor layer disposed on the non-magnetic semiconductor layer, wherein the spin diode is configured such that under a forward bias, when a magnetic field applied to the spin diode is less than a threshold value, the spin diode is in a conductive state in which electric current flows through the spin diode, and when the magnetic field applied to the spin diode is greater than the threshold value, the spin diode is in a resistive state in which the electric current flowing through the spin diode is substantially reduced;
(b) a voltage supply wire oriented along a first direction parallel to the magnetic semiconductor layer of the spin diode and positioned on the magnetic semiconductor layer for connecting the magnetic semiconductor layer to a voltage supply $V_{DD}$;
(c) a first control wire for receiving a first input current and a second control wire for receiving a second input current, wherein the first control wire and the second control wire are oriented in parallel along the first direction and positioned on two sides of the spin diode and the voltage supply wire, such that when the first input current flows through the first control wire, the first input current induces a first magnetic field $B_1$ greater than the threshold value in the spin diode, and when the second input current flows through the second control wire, the second input current induces a second magnetic field $B_2$ greater than the threshold value in the spin diode; and
(d) an output wire oriented along the first direction and positioned on the non-magnetic semiconductor layer of the spin diode for outputting a logic "0" or "1" responsive to the first input current and the second input current.

2. The logic cell of claim 1, being a logic NOR gate or a logic XNOR gate.

3. The logic cell of claim 2, wherein the second input current is configured to flow through the second control wire in an opposite direction to the first input current flowing in the first control wire such that when the first input current flows through the first control wire and the second input current flows through the second control wire simultaneously, the first magnetic field $B_1$ induced by the first input current adds to the second magnetic field $B_2$ induced by the second input current to generate an added magnetic field $B_3$ greater than the threshold value in the spin diode, thereby implementing the logic NOR gate.

4. The logic cell of claim 2, wherein the second input current is configured to flow through the second control wire in the same direction as the first input current flowing in the first control wire such that when the first input current flows through the first control wire and the second input current flows through the second control wire simultaneously, the first magnetic field $B_1$ induced by the first input current nullifies the second magnetic field $B_2$ induced by the second input current to generate a subtracted magnetic field $B_4$ less than the threshold value in the spin diode, thereby implementing the logic XNOR gate.

5. The logic cell of claim 1, wherein the non-magnetic semiconductor layer comprises an n-type doped III-V compound containing an element of Group III and an element of Group V.

6. The logic cell of claim 5, wherein the non-magnetic semiconductor layer comprises n-type doped InAs.

7. The logic cell of claim 1, wherein the magnetic semiconductor layer comprises a p-type doped III-Mn-V compound containing an element of Group III, Manganese (Mn) and an element of Group V.

8. The logic cell of claim 7, wherein the magnetic semiconductor layer comprises p-type doped InMnAs.

9. The logic cell of claim 1, wherein the magnetic semiconductor layer forms an anode of the spin diode, and the non-magnetic semiconductor layer forms a cathode of the spin diode.

10. The logic cell of claim 1, wherein the output wire is connected to ground.

11. The logic cell of claim 1, wherein the output wire is connected to one of the first and second control wires for another logic cell.

12. A logic apparatus, comprising at least one logic cell of claim 1.

13. A logic cell, comprising:
(a) a spin diode having a non-magnetic semiconductor layer and a magnetic semiconductor layer disposed on the non-magnetic semiconductor layer, wherein the spin diode is configured such that under a forward bias, when a magnetic field applied to the spin diode is less than a threshold value, the spin diode is in a conductive state in which electric current flows through the spin diode, and when the magnetic field applied to the spin diode is greater than the threshold value, the spin diode is in a resistive state in which the electric current flowing through the spin diode is substantially reduced;
(b) a voltage supply wire oriented along a first direction parallel to the magnetic semiconductor layer of the spin diode and positioned on the magnetic semiconductor layer for connecting the magnetic semiconductor layer to a voltage supply $V_{DD}$;
(c) a first control wire for receiving a first input current, wherein the first control wire is oriented along the first direction and positioned on one side of the spin diode and the voltage supply wire, such that when the first input current flows through the first control wire, the first input current induces a first magnetic field $B_1$ greater than the threshold value in the spin diode; and (d) an output wire oriented along the first direction and positioned on the non-magnetic semiconductor layer of the spin diode for outputting a logic "0" or "1" responsive to the first input current.

14. The logic cell of claim 13, being a logic inverter.

15. The logic cell of claim 13, further comprising a second control wire for receiving a second input current, wherein the second control wire is in parallel to the first control wire and positioned on the other side of the spin diode and the voltage supply wire, such that when the second input current flows through the second control wire, the second input current induces a second magnetic field $B_2$ greater than the threshold value in the spin diode, so as to implement a logic NOR gate or a logic XNOR gate.

16. The logic cell of claim 15, wherein the second input current is configured to flow through the second control wire in an opposite direction to the first input current flowing in the first control wire such that when the first input current flows through the first control wire and the second input current flows through the second control wire simultaneously, the first magnetic field $B_1$ induced by the first input current adds to the second magnetic field $B_2$ induced by the second input current to generate an added magnetic field $B_3$ greater than the threshold value in the spin diode, thereby implementing the logic NOR gate.

17. The logic cell of claim 15, wherein the second input current is configured to flow through the second control wire in the same direction as the first input current flowing in the first control wire such that when the first input current flows through the first control wire and the second input current flows through the second control wire simultaneously, the first magnetic field $B_1$ induced by the first input current nullifies the second magnetic field $B_2$ induced by the second input current to generate a subtracted magnetic field $B_4$ less than the threshold value in the spin diode, thereby implementing the logic XNOR gate.

18. The logic cell of claim 13, wherein the non-magnetic semiconductor layer comprises an n-type doped III-V compound containing an element of Group III and an element of Group V.

19. The logic cell of claim 18, wherein the non-magnetic semiconductor layer comprises n-type doped InAs.

20. The logic cell of claim 13, wherein the magnetic semiconductor layer comprises a p-type doped III-Mn-V compound containing an element of Group III, Manganese (Mn) and an element of Group V.

21. The logic cell of claim 20, wherein the magnetic semiconductor layer comprises p-type doped InMnAs.

22. The logic cell of claim 13, wherein the magnetic semiconductor layer forms an anode of the spin diode, and the non-magnetic semiconductor layer forms a cathode of the spin diode.

23. The logic cell of claim 13, wherein the output wire is connected to ground.

24. The logic cell of claim 13, wherein the output wire is connected to the first control wire for another logic cell.

25. A logic apparatus, comprising at least one logic cell of claim 13.

26. A logic cell, comprising:

(a) first, second, third, fourth, fifth and sixth spin diodes, each spin diode having a cathode and an anode, wherein each of the first, second, third, fourth and fifth spin diodes has a first control wire and a second control wire oriented in parallel and positioned on two sides of the spin diode, and the sixth spin diode has a control wire positioned on one side of the sixth spin diode, configured such that for each spin diode, under a forward bias, when a magnetic field applied to the spin diode is less than a threshold value, the spin diode is in a conductive state in which electric current flows through the spin diode, and when the magnetic field applied to the spin diode is greater than the threshold value, the spin diode is in a resistive state in which the electric current flowing through the spin diode is substantially reduced;

when a control current flows through one of the first and second control wires of each of the first, second, third, fourth and fifth spin diodes, the control current induces a magnetic field greater than the threshold value in the spin diode;

for each of the first, second and third spin diodes, a second control current is configured to flow through the second control wire in an opposite direction to a first control current flowing in the first control wire such that when the first control current flows through the first control wire and the second input current flows through the second control wire simultaneously, the first magnetic field induced by the first control current adds to the second magnetic field induced by the second control current to generate an added magnetic field greater than the threshold value in the spin diode, thereby implementing a logic NOR gate;

for each of the fourth and fifth spin diodes, the second control current is configured to flow through the second control wire in the same direction as the first control current flowing in the first control wire such that when the first control current flows through the first control wire and the second control current flows through the second control wire simultaneously, the first magnetic field induced by the first control current nullifies the second magnetic field induced by the second control current to generate a subtracted magnetic field less than the threshold value in the spin diode, thereby implementing a logic XNOR gate; and for the sixth diode, when a control current flows through the control wire of the sixth spin diode, the control current induces a magnetic field greater than the threshold value in the sixth spin diode, thereby implementing a logic inverter, wherein a second end of the first control wire of the first spin diode is electrically connected to a first end of the first control wire of the third spin diode, wherein a second end of the second control wire of the first spin diode is electrically connected to a first end of the first control wire of the second spin diode, wherein a second end of the first control wire of the second spin diode is electrically connected to a first end of the first control wire of the fifth spin diode, wherein a second end of the second control wire of the second spin diode is electrically connected to a first end of the second control wire of the third spin diode, wherein a second end of the first control wire of the third spin diode is electrically connected to a first end of the first control wire of the fourth spin diode, wherein a second end of the second control wire of the third spin diode is electrically connected to a first end of the second control wire of the fourth spin diode, wherein the cathodes of the first, second and third spin diodes are electrically connected to a first end of the control wire of the sixth spin diode, and wherein the cathode of the fourth spin diode is electrically connected to a first end of the second control wire of the fifth spin diode;

(b) a first input terminal electrically connected to a first end of the first control wire of the first spin diode for providing a first input current, $I_A$;

(c) a second input terminal electrically connected to a first end of the second control wire of the first spin diode for providing a second input current, $I_B$;

(d) a third input terminal electrically connected to a first end of the second control wire of the second spin diode for providing a third input current, $I_C$;

(e) a first voltage supply electrically connected to the anodes of the first, second, third, fourth and fifth spin diodes for providing a first supply voltage, $V_{DD1}$;

(f) a second voltage supply electrically connected to the anode of the sixth spin diode for providing a second supply voltage, $V_{DD2}$;

(g) a sum output terminal electrically connected to the cathode of the fifth spin diode for outputting a sum output signal of a logic "0" or "1" responsive to the first input current $I_A$, the second input current $I_B$, and the third input current $I_C$; and (h) a carry-out output terminal electrically connected to the cathode of the sixth spin diode for outputting a carry-out output signal of the logic "0" or "1" responsive to the first input current $I_A$, the second input current $I_B$, and the third input current $I_C$.

27. The logic cell of claim 26, being a logic one-bit full adder.

28. The logic cell of claim 27, wherein the sum output terminal is configured to output the logic "0" when no input current is provided by any of the first, second and third input terminals, or when exactly two of the first input current $I_A$, the second input current $I_B$, and the third input current $I_C$ are provided by the first, second and third input terminals, and to output the logic "1" when exactly one of the first input current $I_A$, the second input current $I_B$, and the third input current $I_C$ is provided by the first, second and third input terminals, or when all of the first input current $I_A$, the second input current $I_B$, and the third input current $I_C$ are provided by the first, second and third terminals, respectively.

29. The logic cell of claim 27, wherein the carry-out output terminal is configured to output the logic "0" when no input current is provided by any of the first, second and third input terminals, or when exactly one of the first input current $I_A$, the second input current $I_B$, and the third input current $I_C$ is provided by the first, second and third input terminals, and to output the logic "1" when exactly two of the first input current $I_A$, the second input current $I_B$, and the third input current $I_C$ are provided by the first, second and third input terminals, or when all of the first input current $I_A$, the second input current $I_B$, and the third input current $I_C$ are provided by the first, second and third input terminals, respectively.

30. A logic apparatus, comprising at least one logic cell of claim 26.

31. A logic cell, comprising:

(a) first and second spin diodes, each of the first and second spin diodes having a cathode and an anode, and a first control wire and a second control wire oriented in parallel and positioned on two sides of the spin diode, configured such that
under a forward bias, when a magnetic field applied to the spin diode is less than a threshold value, the spin diode is in a conductive state in which electric current flows through the spin diode, and when the magnetic field applied to the spin diode is greater than the threshold value, the spin diode is in a resistive state in which the electric current flowing through the spin diode is substantially reduced;

when a control current flows through one of the first and second control wires, the control current induces a magnetic field greater than the threshold value in the spin diode; and when a first control current flows through the first control wire in an opposite direction to a second control current flowing through the second control wire simultaneously, the first magnetic field induced by the first control current adds to the second magnetic field induced by the second control current to generate an added magnetic field greater than the threshold value in the spin diode, thereby implementing a logic NOR gate, wherein the cathode of the first spin diode is electrically connected to a first end of the first control wire of the second spin diode, and wherein the cathode of the second spin diode is electrically connected to a first end of the second control wire of the first spin diode;

(b) a first input terminal electrically connected to a first end of the first control wire of the first spin diode for providing a first input current, $I_A$;

(c) a second input terminal electrically connected to a first end of the second control wire of the second spin diode for providing a second input current, $I_B$;

(d) a voltage supply electrically connected to the anodes of the first and second spin diodes for providing a supply voltage, $V_{DD}$; and (e) a first output terminal electrically connected to a second end of the first control wire of the second spin diode for outputting a logic "0" or "1" responsive to the first input current $I_A$ and the second input current $I_B$.

32. The logic cell of claim 31, being a logic latch.

33. The logic cell of claim 32, wherein the first output terminal is configured to output the logic "0" when the first input current $I_A$ is provided by the first input terminal, and to output the logic "1" when the second input current $I_B$ is provided by the second input terminal.

34. The logic cell of claim 33, wherein the first output terminal is configured to remain outputting the same logic signal "0" or "1" when no input current is provided by the first and second input terminals.

35. The logic cell of claim 32, further comprising a second output terminal electrically connected to a second end of the second control wire of the first spin diode for outputting the logic "0" or "1" responsive to the first input current $I_A$ and the second input current $I_B$.

36. The logic cell of claim 35, wherein the second output terminal is configured to output the logic "0" when the second input current $I_B$ is provided by the second input terminal, and to output the logic "1" when the first input current $I_A$ is provided by the second input terminal.

37. The logic cell of claim 36, wherein the second output terminal is configured to remain outputting the same logic signal "0" or "1" when no input current is provided by the first and second input terminals.

38. A logic apparatus, comprising at least one logic cell of claim 31.

* * * * *